United States Patent
Dieny et al.

(10) Patent No.: US 9,455,012 B2
(45) Date of Patent: Sep. 27, 2016

(54) MAGNETIC DEVICE WITH SPIN POLARISATION

(71) Applicants: COMMISSARIAT A L'ENERGIE ATOMIQUE ET AUX ENERGIES ALTERNATIVES, Paris (FR); Centre National de la Recherche Scientifique (CNRS), Paris (FR); UNIVERSITE JOSEPH FOURIER GRENOBLE, Grenoble (FR); Université Paris Sud, Orsay (FR)

(72) Inventors: Bernard Dieny, Lans en Vercors (FR); Ricardo Sousa, Grenoble (FR); Bertrand Lacoste, Rion des Landes (FR); Thibaut Devolder, Massy (FR)

(73) Assignees: COMMISSARIAT A L'ÉNERGIE ATOMIQUE ET AUX ÉNERGIES ALTERNATIVES, Paris (FR); CENTRE NATIONAL DE LA RECHERCHE SCIENTIFIC (CNRS), Paris (FR); UNIVERSITE JOSEPH FOURIER GRENOBLE, Grenoble (FR); UNIVERSITÉPARIS SUD, Orsay (FR)

( * ) Notice: Subject to any disclaimer, the term of this patent is extended or adjusted under 35 U.S.C. 154(b) by 0 days.

(21) Appl. No.: 14/952,099

(22) Filed: Nov. 25, 2015

(65) Prior Publication Data

US 2016/0155485 A1    Jun. 2, 2016

(30) Foreign Application Priority Data

Nov. 27, 2014   (FR) .................................... 14 61570

(51) Int. Cl.
*G11C 11/00*    (2006.01)
*G11C 11/16*    (2006.01)
*G11C 11/15*    (2006.01)

(52) U.S. Cl.
CPC .............. *G11C 11/165* (2013.01); *G11C 11/15* (2013.01); *G11C 11/16* (2013.01); *G11C 11/161* (2013.01)

(58) Field of Classification Search
CPC ..... G11C 11/165; G11C 11/161; G11C 11/16; G11C 11/15
USPC ......................................... 365/158, 171, 173
See application file for complete search history.

(56) References Cited

U.S. PATENT DOCUMENTS

| | | | |
|---|---|---|---|
| 6,215,695 B1 * | 4/2001 | Ikeda ...................... | G11C 11/15 365/158 |
| 7,760,535 B2 * | 7/2010 | Parkin ..................... | G11C 11/14 365/158 |

(Continued)

FOREIGN PATENT DOCUMENTS

FR    2 817 998 A1    6/2002

OTHER PUBLICATIONS

Search Report as issued in French Patent Application No. 1461570, dated Jul. 15, 2015.
Houssameddine, D., et al., "Spin-torque oscillator using a perpendicular polarizer and a planar free layer," Nature Materials, vol. 6, Jun. 2007, pp. 447-453.

(Continued)

*Primary Examiner* — Pho M Luu
(74) *Attorney, Agent, or Firm* — Pillsbury Winthrop Shaw Pittman LLP

(57) ABSTRACT

A magnetic device includes a first magnetic layer, known as storage layer, having a uniaxial anisotropy with an easy magnetization axis in the plane of the storage layer and having a magnetization of variable direction having two positions of equilibrium along the easy magnetization axis, a second magnetic layer, known as electron spin polarization layer, having a magnetization perpendicular to that of the storage layer and situated out of plane of the electron spin polarization layer, a device configured to make circulate in the layers, and perpendicularly thereto, a current to switch from one position of equilibrium of the direction of magnetization of the storage layer to the other. The device further includes a device to apply a magnetic field, known as transverse field, the direction of which is substantially parallel to the plane of the storage layer and substantially perpendicular to the easy magnetization axis of the storage layer.

13 Claims, 16 Drawing Sheets

(56) References Cited

U.S. PATENT DOCUMENTS

| | | | | |
|---|---|---|---|---|
| 8,279,666 B2* | 10/2012 | Dieny | .................... | B82Y 25/00 365/157 |
| 8,391,056 B2* | 3/2013 | Klein | ...................... | G11C 11/16 365/158 |
| 8,958,240 B2* | 2/2015 | Dieny | ........................... | 365/158 |
| 2008/0197431 A1 | 8/2008 | Morise et al. | | |
| 2012/0294078 A1 | 11/2012 | Kent et al. | | |

OTHER PUBLICATIONS

Vaysset, A., et al., "Improved coherence of ultrafast spin-transfer-driven precessional switching with synthetic antiferromagnet perpendicular polarizer," Applied Physics Letters, 98, 242511 (2011).

Lee, K.J., et al., "Analytical investigation of spin-transfer dynamics using a perpendicular-to-plane polarizer," Applied Physics Letters, 86, 022505 (2005).

\* cited by examiner

MAGNETIC DEVICE WITH SPIN POLARISATION

CROSS-REFERENCE TO RELATED APPLICATIONS

This application claims priority to French Patent Application No. 1461570, filed Nov. 27, 2014, the entire content of which is incorporated herein by reference in its entirety

FIELD

The present invention relates to a magnetic device with spin polarisation. It finds application in electronics, particularly in the production of memory points and MRAM (Magnetic Random Access Memory) type memories.

The context is that of MRAMs based on magnetic tunnel junctions (also known as magnetoresistive stacks) and more particularly MRAMs in which writing is carried out by spin transfer.

BACKGROUND

FIG. 1 schematically illustrates the structure and the function of a magnetic tunnel junction bearing the reference 1. In a known manner, the magnetic tunnel junction (or magnetoresistive stack) 1 is composed of two magnetic layers 2 and 3 separated by a layer of oxide 4 forming a tunnel barrier, typically made of aluminium or magnesium oxide. The magnetisation of one of the magnetic layers 2, known as storage layer (layer with magnetisation re-orientable along two substantially opposite directions) may be oriented in different directions with respect to the magnetisation of the second layer 3, known as reference layer, the magnetisation of which is pinned in a fixed direction. This pinning is in general achieved by interaction with an adjacent antiferromagnetic layer not represented (exchange anisotropy mechanism). Different levels of resistance of the tunnel junction may be produced as a function of the angle between the magnetisations of the two storage and reference layers. Thus the information is stored in the magnetic element by the parallel or antiparallel magnetic configuration of the magnetisations of the storage 2 and reference 3 layers. Then the variation in resistance as a function of the magnetic configuration is used to reread the information written in the memory cell. When the magnetisations of the magnetic layers 2 and 3 are antiparallel, the resistance of the junction 1 is high; when the magnetisations are parallel, the resistance becomes low. The variation in resistance between these two states may exceed 100% by an appropriate choice of materials. Each tunnel junction 1 constitutes a memory point.

In the most conventional approach of MRAMs with writing by perpendicular magnetic fields, the tunnel junctions 1 are arranged in a square array inserted between two perpendicular arrays of parallel lines: bit lines 5 and word lines 6, one above, the other below the plane of the tunnel junctions 1. The junctions 1 are placed between a transistor 7 and a bit line 5. A current passing in this bit line 5 produces a magnetic field. A current passing in the word line 6 orthogonal to the bit line 5 makes it possible to produce a second magnetic field. At the moment of writing, the transistor 7 is blocked and current pulses are sent simultaneously into the word line 6 and the bit line 5 which intersect at the level of the addressed memory point 1. The combination of these two fields makes it possible to switch the magnetisation of the storage layer of the addressed memory point 1 in the desired direction without affecting the magnetisation of the other memory points. In "reading" mode, the transistor 7 is in saturated regime. The current sent into the bit line 5 uniquely passes through the memory point of which the transistor is open. This current makes it possible to measure the resistance of the junction. By comparison with a reference memory point, the binary state of the memory point ("0" or "1") may thus be determined.

More recently other types of magnetic devices have appeared in which the reversal of magnetisation takes place no longer by external magnetic fields but by using the action exerted by a spin polarised current which enters the storage layer from the tunnel junction. When a spin polarised current is injected into a magnetic nanostructure, this current exerts a torque on the magnetisation of the nanostructure, known as "spin transfer torque" or "spin-torque", which can make it possible to act on the magnetisation of the nanostructure and in particular to re-orientate it in a desired direction. Such magnetic devices are designated by the terminology STT-MRAM for "Spin-Transfer Torque MRAM").

In order to make switching of STT-MRAM more rapid while overcoming phenomena of stochastic switching, a solution proposed in the patent FR2817998 consists, to cause the switching of a magnetic layer of planar magnetisation, in injecting into this layer a spin polarised current, the direction of polarisation of which is perpendicular to the plane of the layers. Such a magnetic device 30 (designated by the terminology OST-MRAM for "Orthogonal Spin-Transfer MRAM") is illustrated in FIG. 2. As for the device of FIG. 1, the device 30 represented includes two magnetic layers 12 and 16 separated by a spacer 14 forming a tunnel barrier, typically made of aluminium or magnesium oxide. The magnetisation of the magnetic storage layer 16 may be oriented along two substantially opposite directions with respect to the magnetisation of the reference layer 12, the magnetisation of which is pinned in a fixed direction. The storage layer 16 may be a simple ferromagnetic layer or a synthetic antiferromagnetic layer constituted of two ferromagnetic layers coupled in an antiparallel manner through a thin antiparallel coupling layer. The same is true for the reference layer 16.

The assembly 12, 14, 16 constitutes a magnetic tunnel junction 15. The device 30 is completed by a separating non-magnetic conducting layer 18 and a magnetic polarisation layer 20 (also designated hereafter by the term perpendicular polariser) having a magnetisation perpendicular to the plane of the layer. The perpendicular polariser 20 may be a simple layer or multilayer or a synthetic antiferromagnetic layer/multilayer as described for example in the article "Improved coherence of ultrafast spin-transfer-driven precessional switching with synthetic antiferromagnet perpendicular polarizer" (Vaysset et al., Applied Physics Letters 98 (2011) 242511).

The polarisation layer lies on a conducting electrode 22. The whole of this stack is inserted between a current distribution not represented and a current switching transistor 26. For the electrons transmitted (or reflected) through the layer 20, the spin direction will be oriented parallel (or antiparallel) to the magnetisation of this layer, that is to say perpendicularly to the plane of the various layers of the junction 15 and in particular to the plane of the storage layer 16. The magnetisation of this layer subjected to this out of plane polarised current of electrons is going to turn along a cone of large angle of axis Oz perpendicular to the plane of the layer, without being able to align itself with the direction of spin due to the demagnetising field which tends to maintain the magnetisation in the plane of the layer. It will be noted that, in this situation where the storage layer 16 has planar magnetisation, the junction preferentially has an elliptical shape assuring a shape anisotropy in the plane favouring a stable alignment of the magnetisation of the storage layer along the large axis of the ellipse.

FIG. 3 symbolically illustrates this rotation. In this device, the spin transfer generated by the current polarised by the perpendicular polariser 20 induces a large angle precessional movement of the magnetisation of the storage layer 16. This precessional movement arises from the fact that the magnetisation of the storage layer 16 tends to go slightly out of plane under the effect of the spin transfer stemming from the perpendicular polariser 20 and then to turn in the out of plane oriented demagnetising field undergone by this storage layer 16. If the current is continuous, the magnetisation of the soft layer does not stop turning which can generate a maintained oscillation of the resistance of the magnetoresistive element. This phenomenon is interesting in itself and makes it possible to envisage the production of frequency tunable RF oscillators as demonstrated for example in the publication "Spintorque oscillator using a perpendicular polarizer and a planar free layer" (D. Houssameddine et al., Nature Materials 6, 447 (2007)).

Under the effect of the spin transfer exerted by the perpendicular polariser 20 on the storage layer 16, the magnetisation describes a quasi-circular trajectory in a plane parallel to the plane of the storage layer as illustrated in FIG. 4 which shows this rotation. A cube corner Oxyz (represented in FIGS. 3 and 4) makes it possible to mark out the different directions, the Oz axis being perpendicular to the plane of the layers.

Nevertheless, for a memory application, it is not sought to generate a maintained magnetisation movement in a storage layer but to switch the magnetisation of the storage layer between two stable positions of magnetisation corresponding to two different levels of electrical resistance.

By controlling the duration of the precessional movement generated by the perpendicular polariser to more or less a half-period, it is possible to use the precessional movement to switch the magnetisation of the planar magnetisation layer 16 between two opposite directions. The advantage of this approach is that the switching is in principle very rapid (of the order of 0.3 ns) and not very sensitive to stochastic fluctuations. In fact, the precessional frequencies in these devices are typically in the range of 3 GHz to 10 GHz which corresponds to magnetisation rotation periods of 300 to 100 ps and thus to times of switching the state of the memory cell of 150 to 50 ps (the time to make a half turn being half the time to make a complete turn). Another advantage of this approach is the fact that the writing current pulses may be all of same polarity. Each pulse will trigger a rotation in the direct trigonometric sense (or inverse if the polarity of the pulses is reversed) but the magnetisation may be switched by 180° jumps) while still turning in the same sense.

Nevertheless, such a configuration has at least two drawbacks.

Firstly, it makes it necessary to read the magnetic state of the storage layer before writing. In fact, if the final state that it is wished to write corresponds to the initial state, no current pulse must be sent. It suffices to leave the memory in its current state. On the other hand, if the reading reveals that the memory is not in the state that it is wished to write, it is then necessary to send a current pulse to switch it to the opposite state. The problem is that this step of reading preceding writing may take several nanoseconds thus even if the magnetic switching is then rapid, the fact of having to read before writing lengthens the writing cycle by several nanoseconds which makes this approach unusable for applications requiring writing durations of the order of the sub-nanosecond.

A second drawback resides in the necessity of having to control the duration of the pulses at the scale of 50 ps to be sure to make a half-precession to the magnetisation of the storage layer. The precessional movement leads to a probability oscillating as a function of the duration of the pulses between 0% and 100% of arriving in the state opposite to the starting state (that is to say finish in the parallel state starting from the antiparallel state and vice-versa to finish in the antiparallel state starting from the parallel state). The precession frequency increases with the intensity of the current passing through the device. This leads to a variation in the probability of switching oscillating as a function of the duration of the current pulses at constant current density amplitude or as a function of the current density at constant duration as illustrated in FIG. 5. It is possible to switch the magnetisation of the storage layer by making it do a 1/2 turn but it could be done in principle by making 3/2 turns, 5/2 turns . . . . But in all cases, it is necessary to control the duration of the current pulse to better than more or less ±1/4 period i.e. of the order of 50 ps. This is feasible at the scale of an individual memory point but much more difficult at the scale of an entire memory chip comprising millions of memory points. In fact, due to the resistances of the current lines which interconnect all of the memory points (the aforementioned bit lines and word lines), their parasite capacitances and inductance, a current pulse propagating along the interconnection lines has a tendency to be attenuated and to deform. The pulse thus does not have the same profile at the level of the first memory point and the final one along a same line or column of memory points which makes this precise control of the duration of the pulses very difficult. FIG. 6 shows the probability of switching the storage layer as a function of the duration of the pulse confirming the diagram of FIG. 5.

SUMMARY

In this context, an aspect of the present invention is directed to providing a magnetic device with writing via the precession of magnetisation by spin transfer making it possible to be free of the previously cited requirements on the too precise control of the current pulse duration (that is to say a duration less than 300 ps controlled to more or less ±50 ps) passing through the device and making it possible to carry out writing not requiring reading of the device before writing.

To this end, an aspect of the invention is directed to a magnetic device comprising:
  a first magnetic layer, known as storage layer, having a uniaxial anisotropy with an easy magnetisation axis in the plane of said storage layer and having a magnetisation of variable direction having two positions of equilibrium along the easy magnetisation axis;
  a second magnetic layer, known as electron spin polarisation layer, having a magnetisation perpendicular to that of the storage layer and situated out of plane of the electron spin polarisation layer;
  a device configured to make circulate in the layers, and perpendicularly thereto, a current to switch from one position of equilibrium of the direction of magnetisation of the storage layer to the other;
the device comprising a device configured to apply a magnetic field the direction of which is substantially parallel to the plane of the storage layer and substantially perpendicular to the easy magnetisation axis of the storage layer.

Storage layer having strong uniaxial anisotropy with an axis of easy magnetisation is taken to mean a storage layer made of a ferromagnetic material for which there exists a magneto-crystalline anisotropy due to interactions between the magnetic moment and the crystal lattice. The result is a direction known as easy magnetisation direction in which the magnetisation is going to align itself naturally in the absence of external stress. A shape anisotropy is going to be able to be added to this crystalline anisotropy, depending this time on the shape of the junction: for example, if a storage layer (and thus a junction) of elongated shape (for example oval or elliptical) is used, the shape anisotropy is going to tend to align the magnetisation along the largest axis of the junction. If the axis of easy magneto-crystalline magnetisation is oriented along this same direction, the effects are going to be added together and an important stability of the storage layer is going to be obtained.

An aspect of the invention is based on the principle of applying, at least for the duration of writing (that is to say for the duration where it is wished to give to the magnetisation of the storage layer one or the other of its positions of equilibrium) a field that is transverse to the direction of easy magnetisation of the storage layer, this field being applied substantially in the plane of the layer. This transverse field is applied in the correct sense along the direction of the writing current pulse to favour the initial rotation of the magnetisation during the part of the precession between the starting state and the moment where the planar component of the magnetisation is along the transverse direction and then penalises the precession of the magnetisation between this transverse position and the transverse position of opposite sense. This transverse field helps to initiate the precessional movement of the magnetisation during the first quarter of rotation of the magnetisation of the storage layer but then hinders the precessional movement during the following half period by forcing the magnetisation of the storage layer to remain in the hemisphere of this transverse field.

In other words, thanks to the application of this transverse field, the magnetisation of the storage layer is helped to start its switching movement under the effect of spin transfer due to the perpendicular polariser, while retaining it in the hemisphere of the transverse field which prevents it going into a continuous rotational movement as when the transverse field is not applied.

It will be noted that the transverse field is present during writing but that it is not necessarily present outside of writing. It may even be desirable in certain cases that it is not present outside of writing because it is capable of adversely affecting the thermal stability of the magnetisation of the storage layer by reducing the height of barrier separating the parallel (P) state from the antiparallel (AP) state. However, from a practical viewpoint, it is easier to apply this field permanently on the device. In this case, as will be seen hereafter, the field may be created by a fixed magnetisation layer made of hard material or pinned by exchange anisotropy. To apply a field uniquely during writing, a solution may consist in adding an additional conducting line above or below the memory points as in the case of MRAM devices with field writing. The direct consequence is an increase in the electrical consumption associated with the generation of this field by current pulse during writing. With a view to reducing electrical consumption, the application of a permanent transverse field is thus a priori preferable.

The magnetic device according to an embodiment of the invention may also have one or more of the following characteristics, considered individually or according to any technically possible combinations thereof:

the device configured to make a current circulate and the device configured to apply a transverse magnetic field are configured such that the scalar product $(\vec{J} \times \vec{M}_{initial}) \cdot \vec{H}$, the sign "×" designating the vectorial product, is of the same sign as the component of the magnetisation of the polarisation layer along an axis going from the polarisation layer to the storage layer, where $\vec{M}_{initial}$ represents the initial magnetisation vector in one of the two positions of equilibrium of the storage layer, $\vec{J}$ represents the current density vector to switch the magnetisation of the storage layer from the initial state $\vec{M}_{initial}$ corresponding to the position of equilibrium before switching to the final state corresponding to the second state of equilibrium after switching and $\vec{H}$ represents the vector of the transverse field;

the device according to an embodiment of the invention comprises:
a third magnetic layer, known as reference layer, having a fixed magnetisation direction situated in the plane of the reference layer substantially along the easy magnetisation axis;
a non-magnetic layer, known as first spacer, separating the reference layer and the storage layer;

at least one of the reference, storage or electron spin polarisation layers is a synthetic antiferromagnetic layer formed of two layers of fixed magnetisation and coupled in an antiparallel manner by a layer able to induce an antiferromagnetic coupling between the ferromagnetic layers;

at least one of the reference or electron spin polarisation layers has a magnetisation pinned by interaction with an antiferromagnetic pinning layer;

the reference layer and the spin polarisation layer are chosen such that the scalar product $(\vec{M}_{planaranalyser} \times \vec{P}) \cdot \vec{H}_y$ is strictly positive, where $\vec{M}_{planaranalyser}$ is the vector of fixed magnetisation direction of the reference layer and $\vec{P}$ is the magnetisation vector of the spin polarisation layer;

the device according to an embodiment of the invention comprises a layer, known as second spacer, separating the storage layer and the electron spin polarisation layer;

the product of the resistance times the surface of the first spacer is greater than the product of the resistance times the surface of the second spacer;

the first spacer is a tunnel barrier and the second spacer is chosen from the following elements:
a tunnel barrier;
a confined current path barrier;
a non-magnetic metal layer;

the device configured to apply the transverse field is formed by a layer of ferromagnetic material;

the device configured to apply the transverse field is formed by a layer of ferromagnetic material the magnetisation of which is pinned by an antiferromagnetic layer;

the device configured to apply the transverse field is formed by a field generation conducting line in which a current circulates;

the device configured to apply the transverse field is formed by two permanent magnets situated on either side of the magnetic stack;

the device configured to apply the transverse field is formed by a permanent magnet situated above or below the magnetic stack.

BRIEF DESCRIPTION OF THE DRAWINGS

Other characteristics and benefits of the invention will become clearer from the description that is given thereof below, for indicative purposes and in no way limiting, with reference to the appended figures, among which.

DETAILED DESCRIPTION

FIGS. 1 to 6 have already been described with reference to the prior art.

A cube corner Oxyz makes it possible to mark out the different directions, the Oz axis being perpendicular to the plane of the layers.

Figure 7:
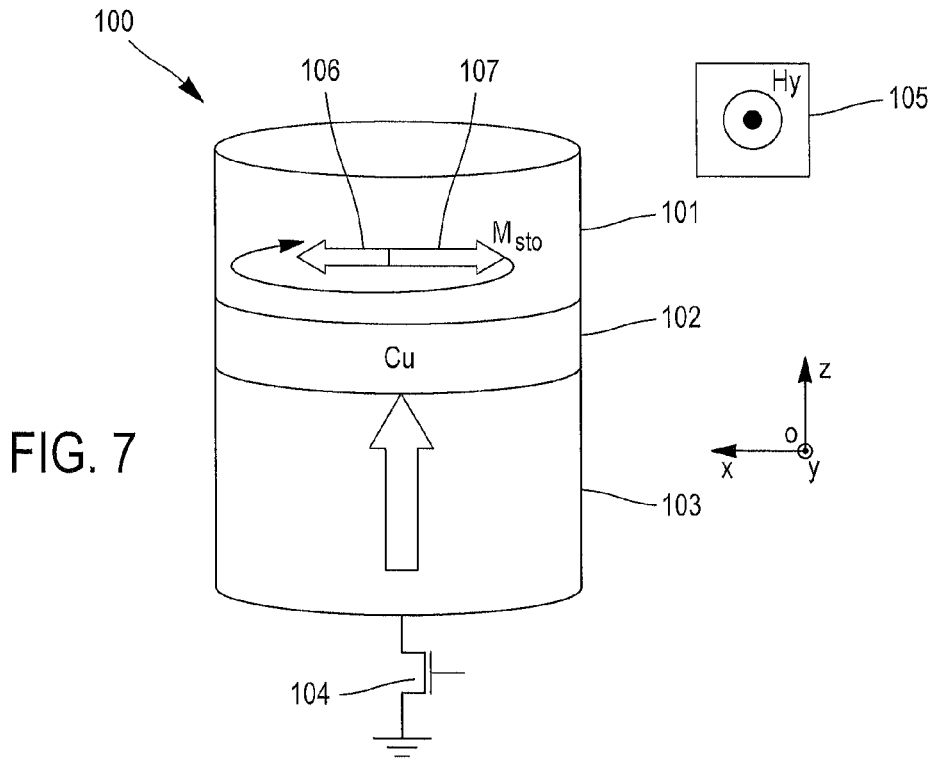
FIG. 7 schematically represents a magnetic device according to an embodiment of the invention.

FIG. 7 schematically represents a magnetic device 100 according to an embodiment of the invention.

The magnetic device 100 comprises:
a magnetic storage layer 101 having a uniaxial anisotropy with an easy magnetisation axis (in this particular case the Ox axis) in the plane of the storage layer; the storage layer 101 has a magnetisation of variable direction having two equilibrium positions along the Ox axis;
a spacer 102;
an electron spin polarisation layer 103 (also designated by the terminology perpendicular polariser), having a magnetisation out of plane of the polarisation layer and of direction perpendicular to the easy magnetisation axis.

As mentioned above, the magnetisation vector $\vec{M}_{STO}$ of the storage layer 101 has two positions of equilibrium 107 and 106 (equally designated hereafter by the terminology first stable state and second stable state) directed respectively substantially along the sense of the Ox axis and along the sense opposite to the Ox axis.

The storage layer 101, in an embodiment, has an elongated shape (for example elliptical) so as to reinforce the uniaxial anisotropy to give to the magnetisation of the storage layer a shape anisotropy in the plane enabling the magnetisation to have a certain stability.

This stack formed by the above series of layers is inserted between a current distribution not represented and a current switching device 104 which is here a transistor enabling an electric current to circulate perpendicularly to the plane of the stack of magnetic layers.

The device 100 according to an embodiment of the invention further comprises a device 105 configured to apply a magnetic field Hy, known as transverse field, the direction of which is substantially parallel to the plane of the storage layer 101 and substantially perpendicular to the easy magnetisation axis Ox. In other words, the transverse field Hy is here directed substantially along the Oy axis.

The device 105 configured to apply the transverse field is configured to enable the application of the transverse field at least during the writing phase, that is to say during the phase making it possible to pass from one position of equilibrium of the direction of magnetisation (respectively 106 or 107) of the storage layer 101 to the other (respectively 107 or 106).

The illustration of the operation in writing of the device 100 of FIG. 7 will now be made with reference to FIGS. 8 and 9.

Figure 8:
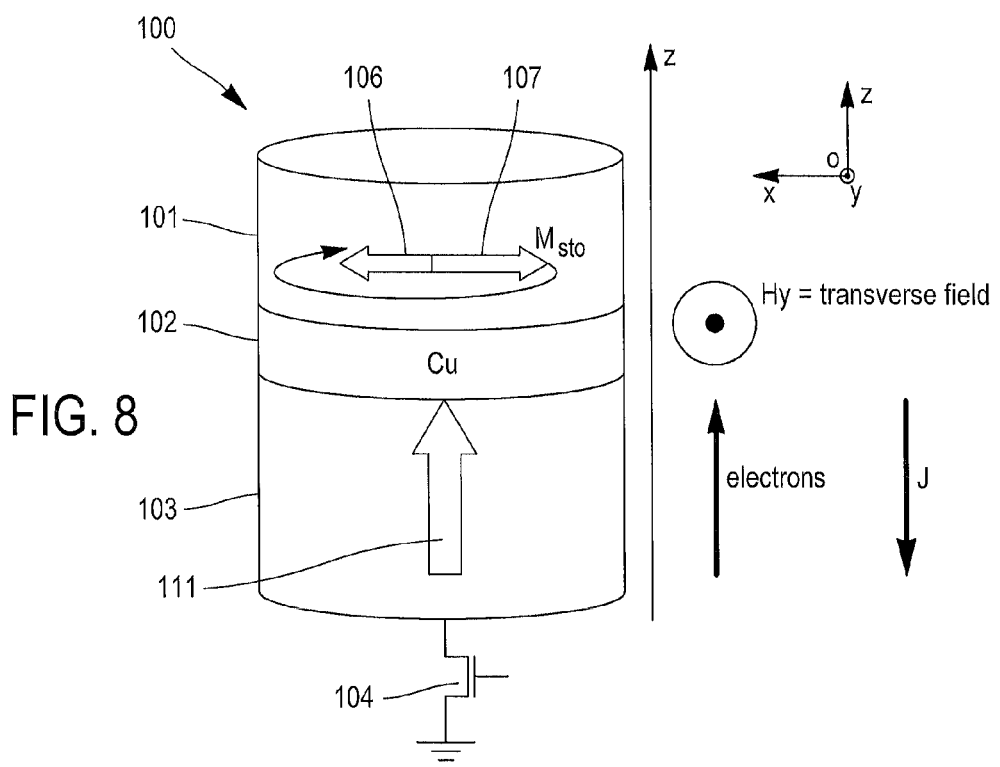
FIGS. 8 and 9 schematically illustrate the functioning in writing of the device of FIG. 7.

In FIG. 8, starting from a first stable state 107 that is to say in which the magnetisation of the storage layer 101 is substantially along the sense opposite to the Ox axis, the second stable state 106 may be written (i.e. switch the magnetisation of the storage layer 101 from the first stable state 107 to the second stable state 106) by sending a pulse of electrons from the perpendicular polariser 103 to the storage layer 101 (that is to say a current pulse from the storage layer 101 to the polariser 103), the transverse field vector $\check{H}_y$ pointing along the sense of the Oy axis as indicated in FIG. 8 in the same hemisphere as the vectorial product $\check{J} \times \check{M}_{initial}$, the sign "×" designating the vectorial product, where $M_{initial}$ represents the initial magnetisation vector in the position of equilibrium 107 of the storage layer 101 and $\check{J}$ represents the current density vector to pass from the position of equilibrium 107 to the position of equilibrium 106 and circulating from the storage layer 101 to the perpendicular polariser 103.

Figure 9:
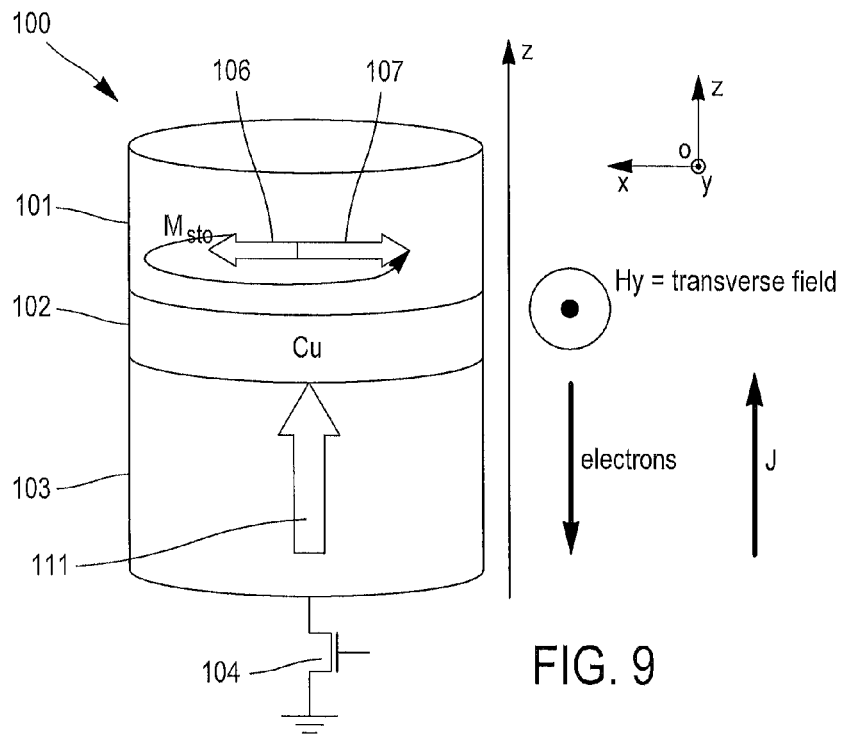

Conversely, as illustrated in FIG. 9, starting from the state of equilibrium 106, it is possible to reach the state of equilibrium 107 while keeping the same transverse field as previously (i.e. FIG. 8) and while reversing the direction of the writing current.

Thus, thanks to the application of this suitably chosen transverse field, benefit is still made from very rapid switching (sub-nanosecond) but the final state is here controlled by the direction of the current passing through the stack independently of the duration of the writing current pulse. The double constraint of having to read before writing and of having to control the duration of the pulse with a precision of ±50 ps is lifted.

Figure 10:
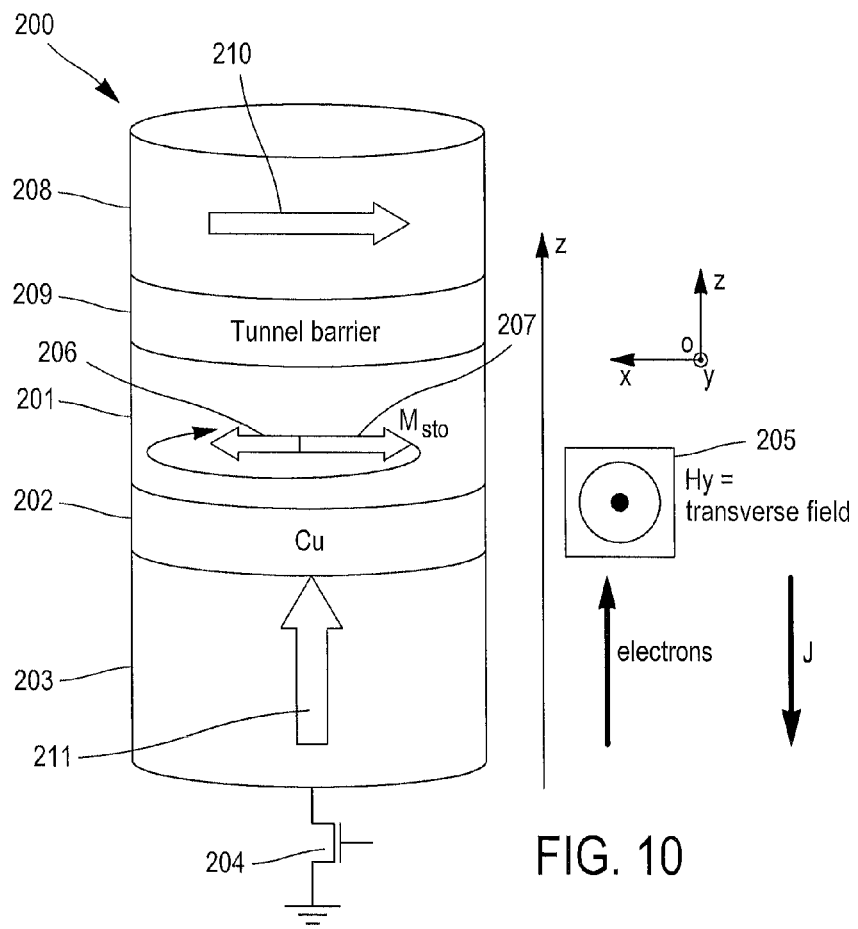
FIG. 10 schematically represents a magnetic device according to an embodiment of the invention applied to the case of a MRAM device.

The device according to an embodiment of the invention finds particularly interesting application when it is used as memory device of MRAM (Magnetic Random Access Memory) type. Such a device 200 is illustrated in FIG. 10.

The magnetic device 200 comprises:
- a magnetic reference layer 208 of fixed magnetisation direction 210 (here along the sense opposite to the Ox axis);
- a non-magnetic spacer 209;
- a magnetic storage layer 201 having a uniaxial anisotropy with an easy magnetisation axis (in this particular case the Ox axis) in the plane of the storage layer; the storage layer 201 has a magnetisation of variable direction having two positions of equilibrium along the Ox axis;
- a spacer 202;
- an electron spin polarisation layer 203 (also designated by the terminology perpendicular polariser), having a magnetisation 211 out of plane of the polarisation layer and of direction perpendicular to the easy magnetisation axis.

This stack formed by the above series of layers is inserted between a current distribution not represented and a current switching device 204 which is here a transistor making it possible to make an electric current circulate perpendicular to the plane of the stack of magnetic layers.

The spacer 209 forms a tunnel barrier and separates the reference layer 208 from the storage layer 201 whereas the spacer 202 separates the perpendicular polariser 203 from the storage layer 201.

The magnetisation vector $\check{M}_{STO}$ of the storage layer 201 has two positions of equilibrium 207 and 206 (equally designated hereafter by the terminology first stable state and second stable state) directed respectively substantially along the sense of the Ox axis and along the sense opposite to the Ox axis. The stack thus has two stable magnetic states:
- a first state known as parallel P state in which the magnetisation 210 of the reference layer 208 is parallel to the magnetisation of the storage layer 201 (position of equilibrium 207);
- a second state known as antiparallel state in which the magnetisation 210 of the reference layer 208 is in the sense opposite to the magnetisation of the storage layer 201 (position of equilibrium 206).

The stack has magnetoresistive properties that is to say that it is such that the two stable magnetic states are characterised by two different values of electrical resistance of the structure. The stack may be a magnetoresistive stack, or a metal structure or with confined current path with giant magnetoresistance, or a structure known as spin filter including a magnetic oxide barrier. The switching from one magnetic state to the other takes place by spin transfer, that is to say by means of a spin polarised current passing through the storage layer 201.

The spacer 202 has a resistance less than that of the magnetoresistive element formed by the reference layer 208 and the storage layer 201 separated by the non-magnetic spacer 209. The electrical resistance of the spacer 202 should in fact be sufficiently low compared to that of the magnetoresistive element such that the magnetoresistance effect of the device 200 is not too reduced in relative value by the resistance in series of the spacer 202. The second spacer 202 is in contact with the storage layer 201 on the opposite side of the magnetoresistive element.

The electron spin polarisation layer 203 is in contact with the spacer 202.

The storage layer 201 has a uniaxial anisotropy which can be reinforced by giving to the structure an elliptical elongated shape in order to give to the magnetisation of the storage layer a shape anisotropy in the plane enabling the magnetisation to have a certain stability and thus enabling the memory to have a certain retention. This uniaxial anisotropy confers to the magnetisation of the storage layer 201 the two stable states of magnetisation substantially parallel and antiparallel to the magnetisation of the reference layer 209.

As in the case of the device 100 of FIG. 7, the device 200 further comprises a device 205 configured to apply a magnetic field Hy, known as transverse field, the direction of which is substantially parallel to the plane of the storage layer 201 and substantially perpendicular to the easy magnetisation axis Ox. In other words, the transverse field Hy is here directed substantially along the Oy axis.

The device 205 configured to apply the transverse field is configured to enable the application of the transverse field at least during the writing phase, that is to say during the phase making it possible to pass from one position of equilibrium of the direction of magnetisation (respectively AP or P) of the storage layer 201 to the other (respectively P or AP).

As illustrated in FIG. 10, starting from the parallel P state (configuration of equilibrium 207) that is to say in which the magnetisation of the storage layer 201 is substantially parallel to the magnetisation 210 of the planar magnetisation reference layer 208 (designated equally by the term planar analyser), it is possible to write the AP (antiparallel) state by sending a pulse of electrons from the perpendicular polariser 203 to the storage layer 201 (that is to say a current pulse from the storage layer 201 to the reference layer 208), the transverse field vector $\check{H}_y$ pointing along the sense of the Oy axis as indicated in FIG. 10 in the same hemisphere as the vectorial product $\check{J} \times \check{M}_{initial}$, the sign "×" designating the vectorial product, where $M_{initial}$ represents the initial magnetisation vector in the magnetic state P and $\check{J}$ represents the current density vector to pass from the P state to the AP state circulating from the storage layer 201 to the perpendicular polariser 203.

Conversely, starting from the antiparallel AP state, it is possible to arrive at the P state while keeping the same transverse field as previously and while reversing the direction of the writing current.

Figure 1:
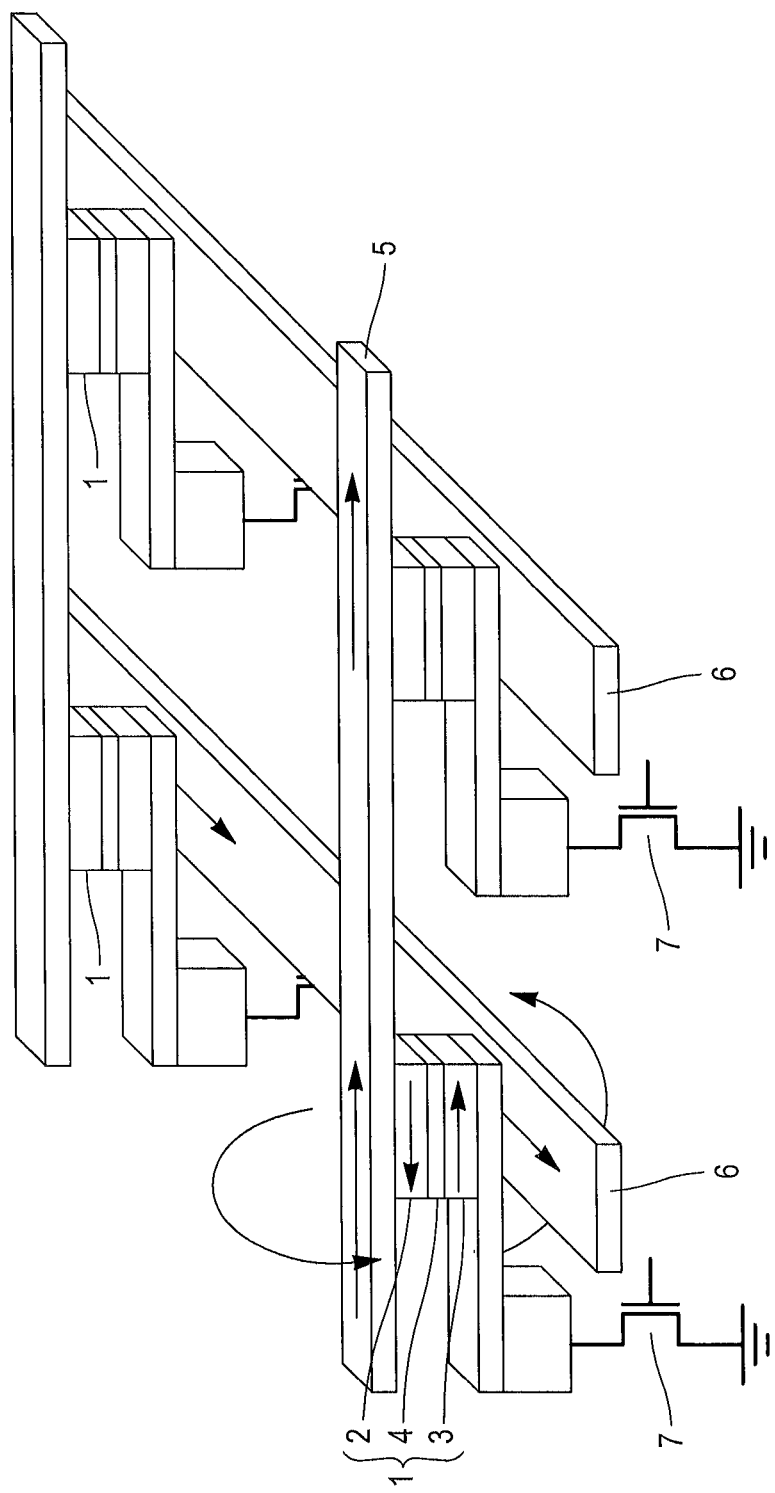
FIG. 1 schematically represents a set of magnetic tunnel junctions in a memory device illustrating the structure and the function of a magnetic tunnel junction.
Figure 2:
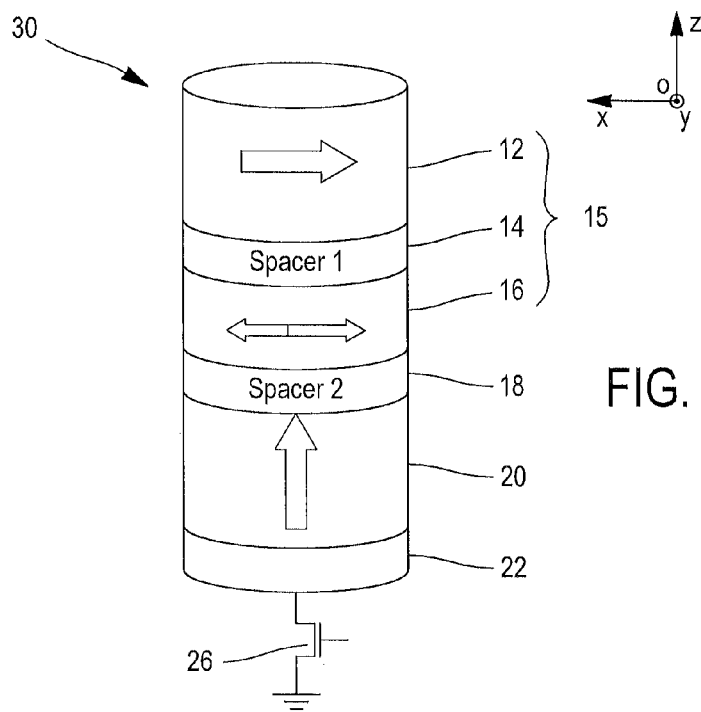
FIG. 2 illustrates a magnetic device according to the prior art.
Figure 3:
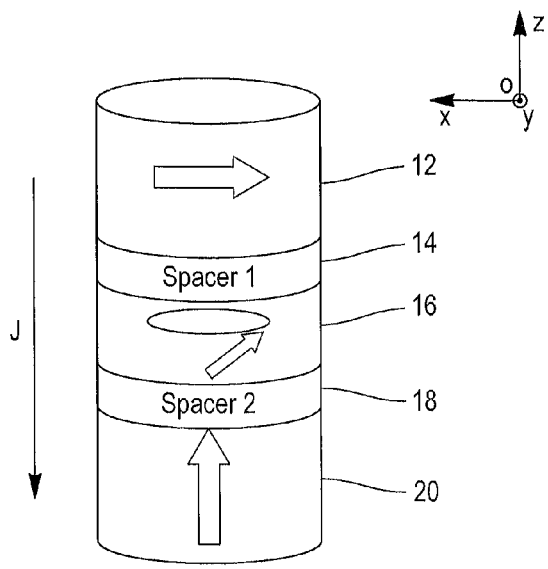
FIG. 3 shows the rotation of the magnetisation of the storage layer in the device of FIG. 2.
Figure 4:
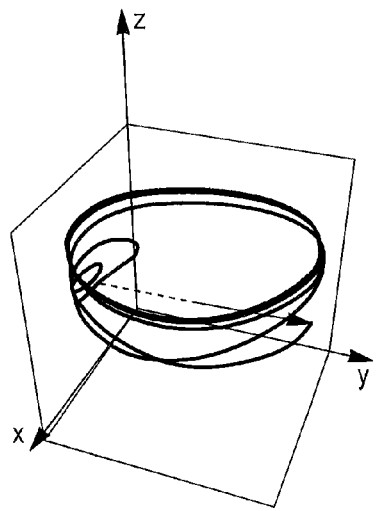
FIG. 4 shows the circular trajectory of the magnetisation in a plane parallel to the plane of the storage layer of the device of FIG. 2.
Figure 5:
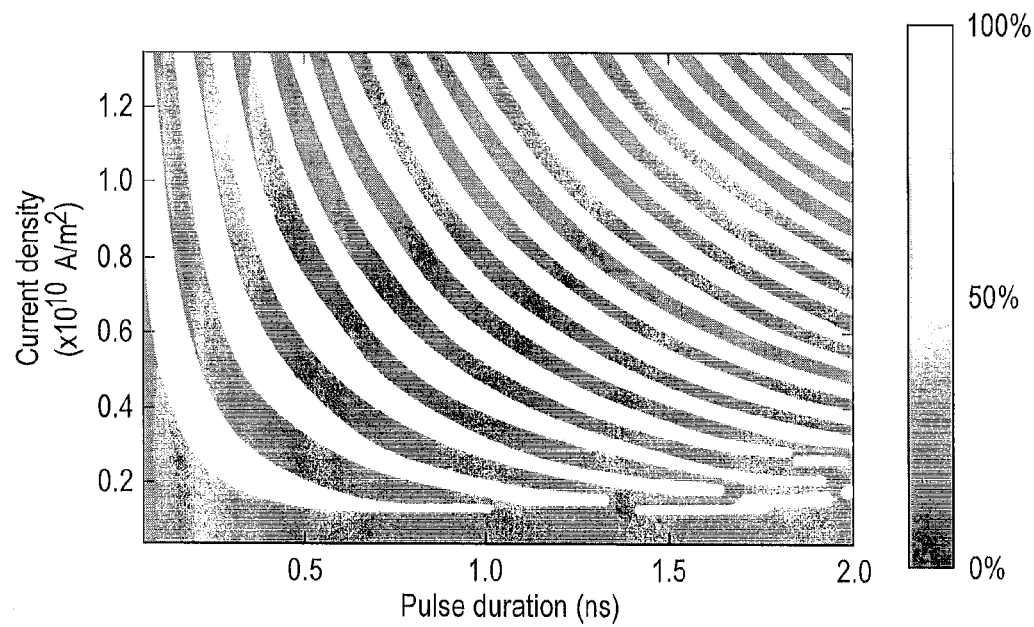
FIG. 5 represents the variation in the probability of switching the magnetisation of the storage layer of the device of FIG. 2 oscillating as a function of the duration of the current pulses at constant current density amplitude or as a function of the current density at constant duration.
Figure 6:
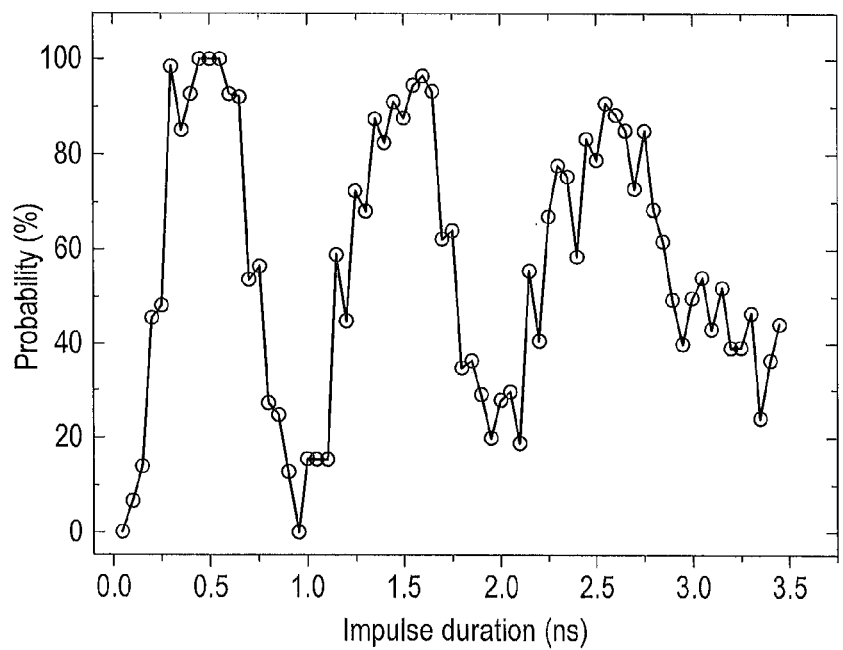
FIG. 6 shows the probability of switching the magnetisation of the storage layer of the device of FIG. 2 as a function of the duration of the pulse.
Figure 11A:
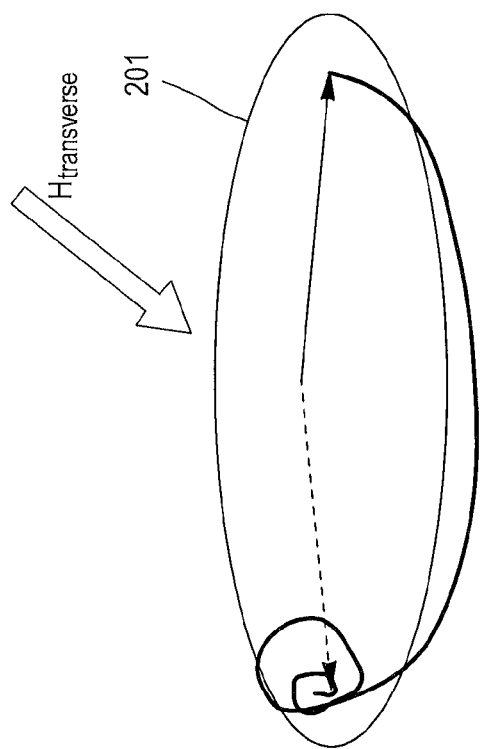
FIGS. 11a and 11b represent respectively the dynamic of the magnetisation of the storage layers of the device of FIG. 2 and of the device according to an embodiment of the invention of FIG. 10.
Figure 11B:
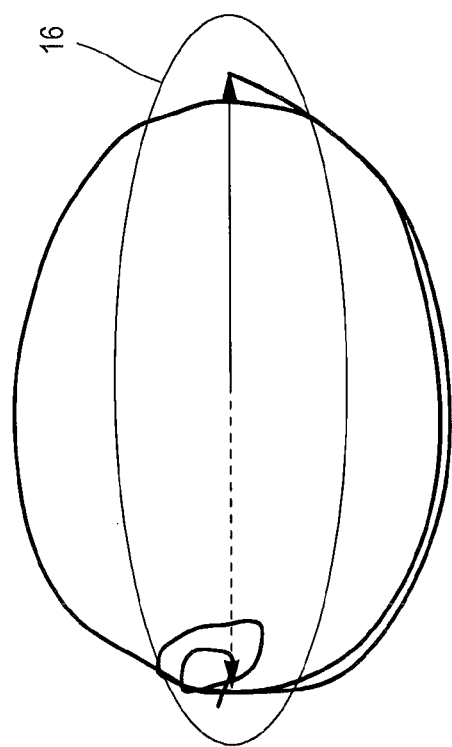

The influence of the transverse field is illustrated in FIGS. 11a and 11b which represent respectively the dynamic of the magnetisation of the storage layers 16 and 201 of elliptical shape of the device 30 of the prior art and the device 200 according to an embodiment of the invention. The ellipses represent the storage layers 16 and 201 in top view. FIG. 11a illustrates the dynamic of magnetisation under the effect of spin transfer due to the perpendicular polariser in the absence of transverse field. As long as current circulates, the magnetisation of the storage layer turns on a circular trajectory as also represented in FIGS. 3 and 4. In the presence of the transverse field (FIG. 11b), the magnetisation is prevented from going into the hemisphere opposite to the transverse field. It is retained by the transverse field in its hemisphere. As a result, even if the duration of the current pulse exceeds a half precession, the magnetisation will be prevented from carrying out a continuous precessional movement. Consequently, when the current is stopped, the magnetisation of the storage layer relaxes in the direction opposite to the starting state.

In a known manner, when a current circulates through a stack such as that of the device 200, the magnetisation of the storage layer 201 is subjected to the influence of two contributions to the spin transfer:

The contribution due to the perpendicular polariser 203 which tends to generate a precessional movement of the magnetisation of the storage layer 201.

The contribution due to the reference layer 208 which as in conventional planar magnetic tunnel junctions generates a switching of which the final state is controlled by the direction of the current (parallel P state favoured if the electrons go from the reference layer 208 to the storage layer 201 and antiparallel AP state favoured when the electrons go from the storage layer 201 to the reference layer 208).

The dynamic of magnetisation of the storage layer $\vec{M}_{sto}$ is described by the Landau Lifshitz Gilbert equation in the presence of the two contributions of spin transfer described previously:

$$\frac{d\vec{M}_{sto}}{dt} = \gamma_0 \vec{M}_{sto} \times \vec{H}_{eff} + \frac{\alpha}{M_S} \vec{M}_{sto} \times \frac{d\vec{M}_{sto}}{dt} + a_{JLong}\vec{M}_{sto} \times \left(\vec{M}_{ref} \times \vec{M}_{sto}\right) + a_{jPerp}\vec{M}_{sto} \times \left(\vec{P} \times \vec{M}_{sto}\right)$$

where $\vec{M}_{STO}$ designates the magnetisation vector of the storage layer, $H_{eff}$ designates the effective field, $-\gamma_0$ designates the gyromagnetic field factor, $\alpha$ designates the Gilbert damping coefficient, Ms designates the spontaneous magnetisation of the storage layer, $\vec{P}$ designates the magnetisation of the perpendicular polariser, $a_{JLong}$ and $a_{JPerp}$ are respectively the pre-factors of spin transfer torques associated with the reference layer and the perpendicular polariser.

The precessional movement triggered by the current pulse is going to be controlled by the first term which is the precessional term. The role of the spin transfer is essentially to counterbalance the dissipation described by the Gilbert damping term which is the second term of the right member of the above equation. The importance of the direction of the transverse field may thus be understood while focusing on the first term:

$$\frac{d\vec{M}_{sto}}{dt} = -\gamma_0 \vec{M}_{sto} \times \vec{H}_{eff}.$$

The effective field $H_{eff}$ acting on the magnetisation is here dominated by the demagnetising field term. Let us consider the situation of FIG. 8 in which the initial state corresponding to $\vec{M}_{sto}$ is oriented in a first stable state 107. In FIG. 8, it is assumed for example that the magnetisation of the storage layer in this first stable state is initially oriented towards the right (state 107). When a current pulse is sent from the storage layer 101 to the perpendicular polariser 103, that is to say electrons going from the perpendicular polariser 103 to the storage layer 101, the magnetisation of the storage layer 101 tends to go out of plane. If the magnetisation of the perpendicular polariser 103 is upwards as in FIG. 8, the magnetisation of the storage layer 101 for this current direction will have a tendency to be drawn into the upper hemisphere such that a demagnetising field out of plane downwards is going to appear and act on the magnetisation of the storage layer 101. This downwards demagnetising field is going to constitute the dominant term of the effective field $H_{eff}$, the other terms being a potential applied field (in particular the field radiated by the other layers) and the planar anisotropy field. Under the effect of the effective vertical field downwards and according to the equation $$\frac{d\vec{M}_{sto}}{dt} = -\gamma_0 \vec{M}_{sto} \times \vec{H}_{eff},$$

the magnetisation is going to turn clockwise as indicated in FIG. 8. The transverse field is then chosen in the substantially transversal direction (orthogonal) to the direction of easy magnetisation (Ox) of the storage layer 101 corresponding to the direction of magnetisation of the storage layer after ¼ period of precession under the effect of the spin transfer due to the perpendicular polariser 103 (that is to say along the Oy axis in FIG. 8).

Similarly, starting from the opposite state of the memory point (which may also be a memristor or a logic device of the MLU "Magnetic Logic Unit" type) that is to say that where the magnetisation of the storage layer 101 is oriented along the second stable state (state 106 towards the left in FIG. 9), by sending a current pulse from the perpendicular polariser 103 to the storage layer 101 that is to say a pulse of electrons going from the storage layer 101 to the perpendicular polariser 103, the magnetisation of the storage layer 101 is going to be drawn out of plane downwards under the effect of the spin transfer due to the perpendicular polariser 103 which is going to lead to a start of precessional movement of the magnetisation anticlockwise as indicated in FIG. 9. By keeping the same direction and the same sense of transverse field Hy as in the preceding case (that is to say a transverse field applied along Oy), this precessional movement is going to be helped by the transverse field Hy during the first ¼ rotation of magnetisation and then braked. This is going to make it possible to stop the precessional movement of large angle once the magnetisation has switched into the right hemisphere.

It may thus be seen that, by keeping the transverse field always oriented in the same sense, it is possible to switch the magnetisation of the storage layer very quickly (at the sub-nanosecond scale) from a first position of equilibrium to a second position of equilibrium and vice-versa without having to control precisely the duration of the current pulse. The two problems encountered in the prior art are thus resolved.

Concerning the choice of the direction and the sense of the transverse field with respect to the sense of the current pulses enabling the writing of the first or second stable state, the transverse field is substantially in the plane of the layer, substantially perpendicular to the easy magnetisation axis Ox of the storage layer 101 making it possible to define the two stable states of magnetisation and in a sense given by $(\check{J} \times \check{M}_{initial}).\check{H}_y$ of the same sign as the component of the magnetisation 111 of the perpendicular polariser along the Oz axis defined in FIGS. 8 and 9, this Oz axis going from the perpendicular polariser 103 to the storage layer 101. $\check{M}_{initial}$ represents the initial state of the storage layer (that is to say $M_{sto}$ in the first or second stable state) and J represents the current density vector to switch the magnetisation of the storage layer 101 from the initial stable state before writing to the final stable state after writing.

The above condition on $(\check{J} \times \check{M}_{initial}).\check{H}_y$ leaves two possibilities of choice concerning the orientation of Hy and the corresponding sense of the current pulses. It is possible in fact at one and the same time to change the sign of Hy and J while satisfying the same condition.

Nevertheless, if it is now considered that the stack of the device 200 of FIG. 10 (perpendicular polariser 203/non-magnetic spacer 202/storage layer 201) constitutes the lower electrode of a magnetic tunnel junction perpendicular polariser 203/non-magnetic spacer 202/storage layer 201/tunnel barrier 209/reference layer 208, it appears that on the two possible directions of Hy and the sense of the writing currents, one choice is preferential compared to the other. In fact, in the situation of FIG. 8, if in addition the planar analyser is added (FIG. 10), the switching of the magnetisation of the storage layer will be favoured by the spin transfer exerted by the planar analyser pinned on the magnetisation of the storage layer if the magnetisation of the planar analyser is towards the right. The same is true in the situation of FIG. 9. Thus for a given sense of orientation of the perpendicular polariser (parallel or antiparallel to the z axis) and for a given sense of magnetisation of the planar analyser (a sense or the opposite sense along the easy magnetisation axis of the storage layer), the desired orientation of the transverse field making it possible to benefit both from the action of the perpendicular polariser and the planar analyser is that which satisfies the inequality: $(\check{M}_{planaranalyser} \times \check{P}).\check{H}_y > 0$.

Hereafter, FIGS. 12 (12a to 12c) to 17 illustrate different dynamic behaviours of the magnetisation of the storage layer as a function of different parameters (current density passing through the stack, value of the transverse field, duration of the current pulse). These figures have been obtained in particular conditions of thickness of storage layer, polarisation of the current delivered by the perpendicular polariser, Gilbert damping, magnetisation, planar anisotropy. These figures are thus given for illustrative purposes to explain the beneficial influence of the application of a transverse field on the control of the dynamic of switching the magnetisation of the storage layer subjected to the spin transfer torque due to the perpendicular polariser. The conditions used in these figures correspond to a storage layer of 3 nm thickness, a spontaneous magnetisation $M_S = 1.2e6$ A/m, a Gilbert damping of $\alpha = 0.02$ and a uniaxial anisotropy field in the plane of 8.5 kA/m.

As regards the amplitude of the transverse field as well as the amplitude of the current density, FIGS. 12a to 12c and FIG. 13 illustrate how these amplitudes are chosen.

Figure 12A:
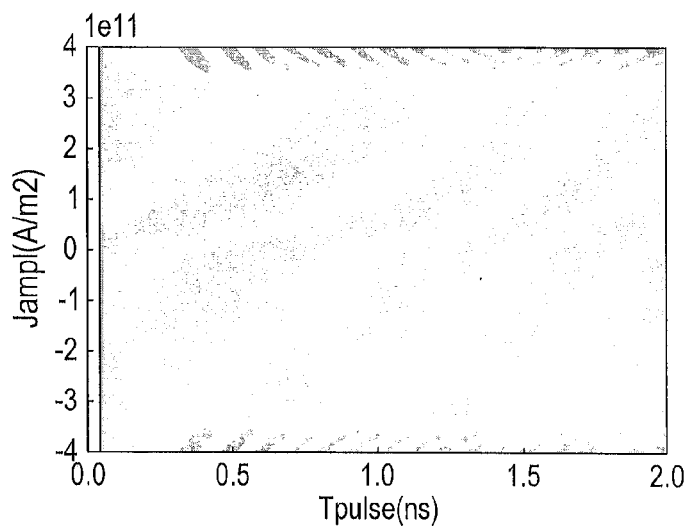
FIGS. 12a to 12c illustrate how the amplitude of the writing current density is chosen for a given value of the transverse field to switch from the antiparallel state to the parallel state or from parallel state to antiparallel state with or without oscillating probability.
Figure 12B:
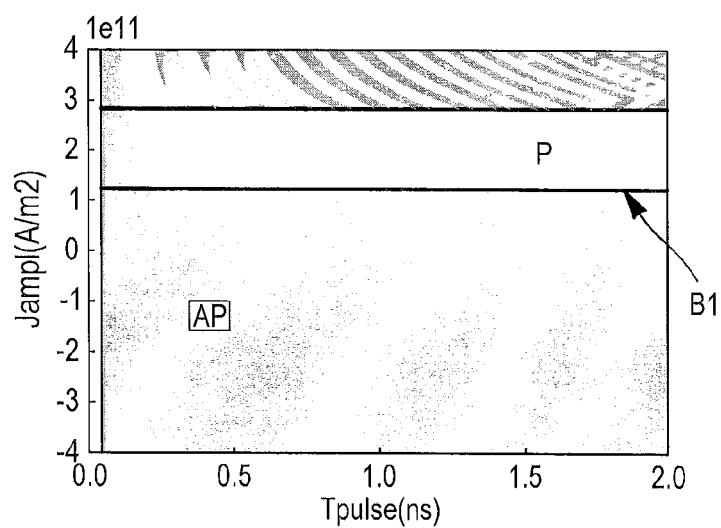
Figure 12C:
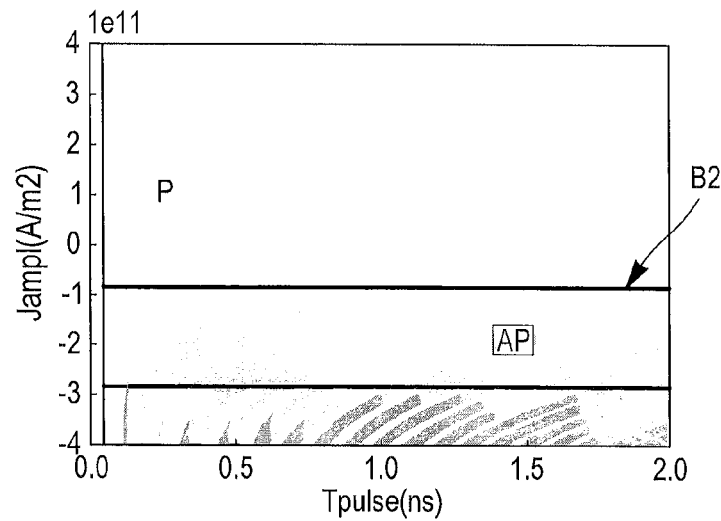

Firstly, FIGS. 12a to 12c illustrate how the amplitude of the writing current density is chosen for a given value of the transverse field to switch from the antiparallel AP state to the parallel P state or from the P state to the AP state with or without oscillating probability. In each of these FIGS. 12a to 12c, the dark zone corresponds to 100% probability of being in the parallel alignment P and the light zone to 100% probability of being in the antiparallel alignment AP. In the absence of transverse field (FIG. 12a), as already discussed with reference to FIG. 5, as soon as the current density (ordinates scale) exceeds a threshold value linked to the planar anisotropy of the storage layer, the magnetisation goes into precessional movement which leads to a probability oscillating as a function of the duration of the pulses. This results in an alternation of dark and light bands as a function of the duration of the pulses. The manner of calculating the current density threshold to trigger the precessional movement of the magnetisation has particularly been described in the article "Analytical investigation of spin-transfer dynamics using a perpendicular-to-plane polarizer" (K J Lee et al., APPLIED PHYSICS LETTERS 86, 022505 (2005), formula 6). This threshold is proportional to the planar anisotropy field of the layer (usually determined by the shape anisotropy of the memory point of elongated shape for example elliptical), proportional to the thickness of the storage layer and to its magnetisation.

In the presence of a transverse field, FIGS. 12b and 12c show that the situation changes. Two bands B1 and B2 then appear substantially comprised between $1.10^{11}$ and $3.10^{11}$ A/m² of current density values for which it is possible to switch from AP to P (FIG. 12b) and from P to AP (FIG. 12c) with the same amplitude of transverse field Hy (here 5 kA/m), just by reversing the sense of the current pulse passing through the stack. These bands B1 and B2 are delimited in these figures by two lines. FIGS. 12b and 12c show that in this interval of current density, the final state of magnetisation of the storage layer is independent of the duration of the pulse when this duration exceeds a duration of the order of 100 to 200 ps. One thus has magnetic switching much shorter than a nanosecond without having to control very precisely the duration of the current pulse. On the other hand, it may be noted that if the current density becomes too high and goes out of the band B1 or B2 delimited by the lines, a return is made to a regime of oscillating probability in which the final state depends on the duration of the pulse.

In other words, for a given value of transverse magnetic field, the value of the current density passing through the device according to an embodiment of the invention is desirably chosen to remain in a range assuring in a certain manner the switching of the magnetisation of the storage layer from the initial state corresponding to a position of equilibrium before writing to the final state corresponding to a second state of equilibrium after writing.

Figure 13:
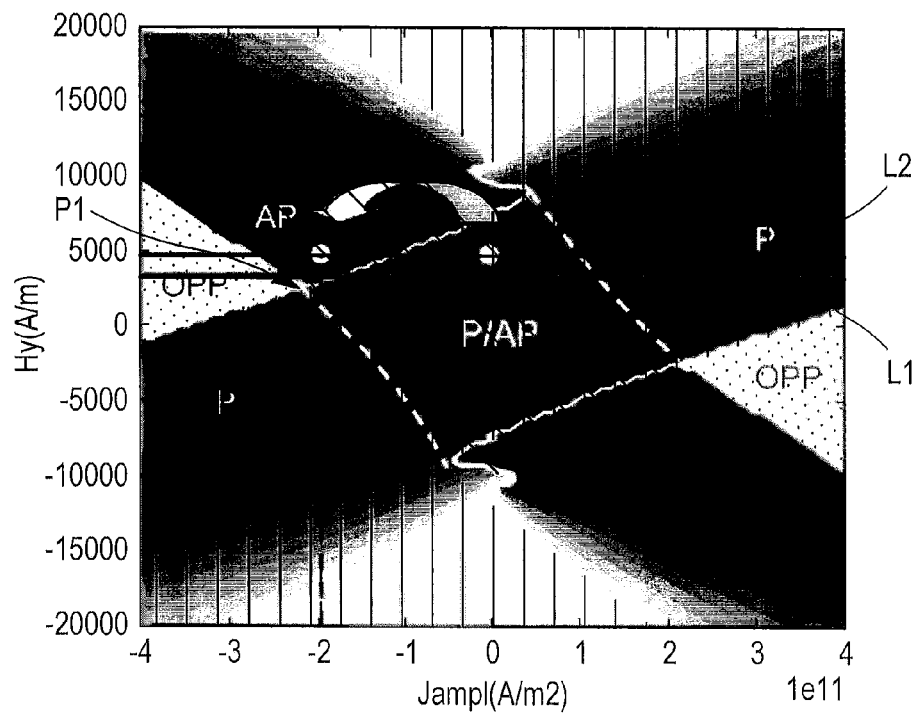
FIGS. 13 and 14 represent stability diagrams of the magnetisation of the storage layer of a device according to an embodiment of the invention under the influence of the spin transfer of the perpendicular polariser in the presence of a transverse magnetic field respectively with an initial parallel and antiparallel state.
Figure 14:
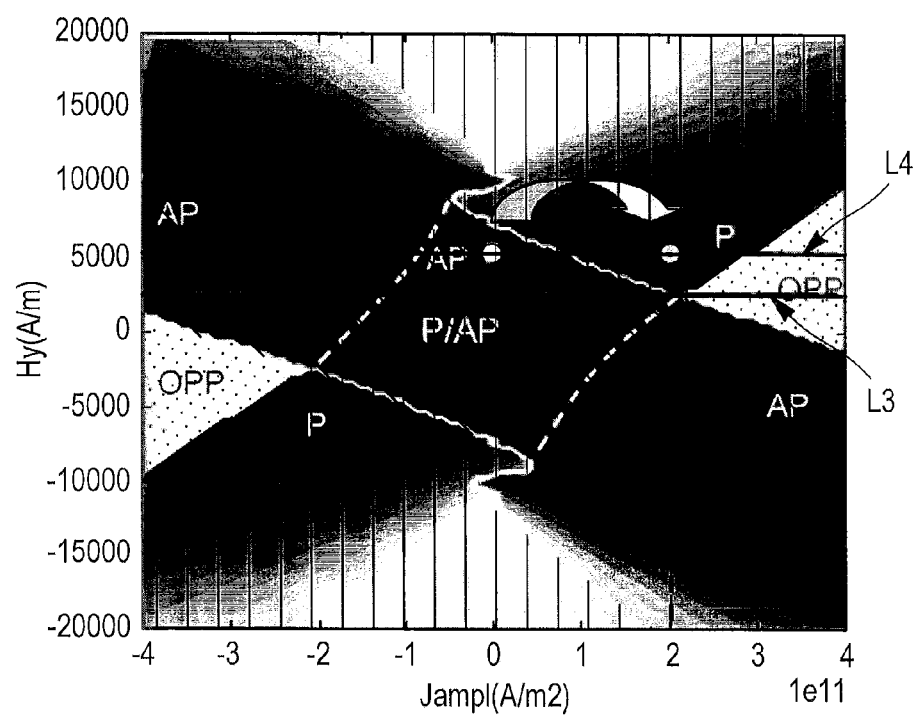

As regards the choice of the amplitude of the transverse field Hy, FIGS. 13 and 14 represent diagrams of stability of the magnetisation of the storage layer under the influence of the spin transfer of the perpendicular polariser in the presence of a transverse magnetic field. FIGS. 13 and 14 illustrate how the transverse field Hy is chosen. In these figures, the vertical y-axis is the transverse field Hy and the horizontal x-axis represents the current density Jampl circulating through the device according to the invention. The different codes (dotted lines, hatching, vertical lines, vertical lines superimposed on hatching) represent the different configurations of the device in the final state:

In the zones of vertical lines—P zones—, the magnetisation is close uniquely to the parallel configuration. Close to the parallel configuration is taken to mean that the angle between the magnetisations of the storage layer and that of the reference layer is less than 90°. When the transverse field increases, this angle firstly has a tendency to increase since the magnetisation of the storage layer is going to tend to turn towards the applied transverse field whereas the magnetisation of the reference layer remains oriented substantially in its pinning direction. Nevertheless when the transverse field is sufficiently strong with respect to the field for pinning the magnetisation of the reference layer, the latter is also going to tend to turn towards the transverse field such that the angle between the magnetisations of the storage and reference layers again is reduced. The grey level in the background of FIGS. 13 and 14 is linked to the absolute value of the cosine of the magnetisation of the storage layer: dark grey in the P zone signifies that the magnetisation of the storage layer is close to its easy magnetisation axis (orientation at 0°); light grey signifies that the magnetisation of the storage layer moves away from the direction of the easy magnetisation axis to come close to an orientation at 90° of the easy magnetisation axis.

In the zones of hatchings—AP zone—Close to the antiparallel configuration is taken to mean that the angle between the magnetisations of the storage layer and that of the reference layer is comprised between 90° and 180°. Referring to the level of grey in the background of FIGS. 13 and 14, dark grey in the AP zone signifies that the magnetisation of the storage layer is close to its easy magnetisation axis (orientation at 180°); light grey signifies that the magnetisation of the storage layer moves away from the direction of the easy magnetisation axis to come closer to an orientation at 90° of the easy magnetisation axis.

In the zone with vertical lines superimposed on hatchings—P/AP zones—, the magnetisation is bistable, that is to say that it may be stabilised in one of the two configurations as a function of events experienced earlier;

In the zones in dotted lines—OPP zone—, the magnetisation is unstable. The designation OPP signifies "Out-of-Plane Precession" which corresponds to the maintained precession regime.

Generally speaking, the more Hy increases, the more the magnetisations move away from their easy magnetisation axis because they are drawn in a perpendicular direction by the transverse field Hy.

FIG. 13 illustrates the diagram for an initial parallel P state whereas FIG. 14 illustrates the diagram for an initial antiparallel AP state.

As illustrated in FIG. 13, to be able to switch from the P state to the AP state in the presence of a transverse field, it is necessary that the transverse field is above the horizontal line L1 passing through the lowest point P1 of intersection between the P/AP zone and the AP zone. If the transverse field has this critical value then the range of current density making it possible to end up in the AP state without going into maintained precession is very narrow (or even virtually reduced to a single value, here equal to a negative current pulse of the order of $-2.10^{11}$ A/m$^2$). It is thus of interest to choose a transverse field sufficiently above (for example corresponding to the line L2) this critical value given by the line L1 to see a wider possible interval of current density value (here typically between $-1.10^{11}$ and $-3.10^{11}$ A/m$^2$) to move away from the two critical lines corresponding on the one side to the absence of switching (line L1) and on the other side the critical line separating the AP zone from the zone corresponding to the maintained precession regime. Nevertheless, the transverse field should not be too high vis-à-vis the planar field anisotropy because this transverse field, if it is applied permanently, tends to move the magnetisation away from the storage layer with respect to its direction of easy magnetisation which means that the system is no longer perfectly in the P or AP state but in intermediate states of relative alignment of the magnetisations of the reference and storage layers. This phenomenon will be returned to in the remainder of the description but this explains why a configuration at 90° of the magnetisation of the storage layer is again found if the transverse field becomes too big at low current density (or at zero current density).

The same is true for FIG. 14 which shows that a same transverse field as to pass from the P state to the AP state may be used to pass from the AP state to the P state thanks to a current pulse substantially of same value but of opposite sense that is to say positive here.

Figure 15:
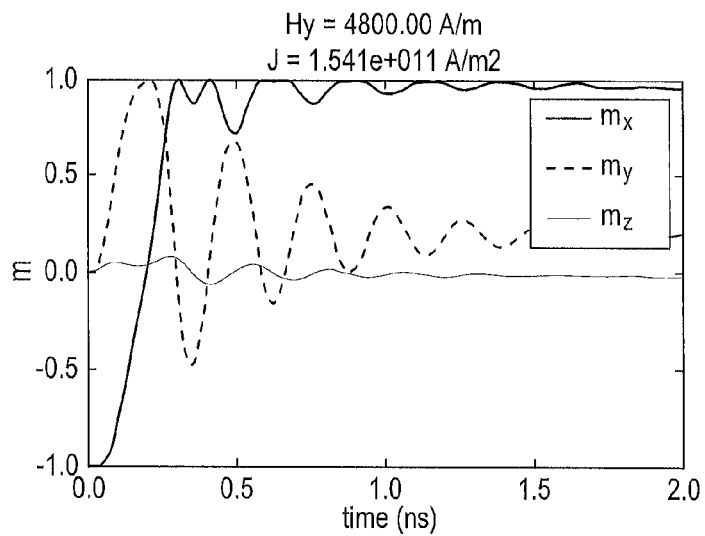
FIGS. 15 to 17 represent examples of temporal variations of the components of the magnetisation of the storage layer of a device according to an embodiment of the invention under the effect of a transverse field with different values of current densities passing through the tunnel junction.
Figure 16:
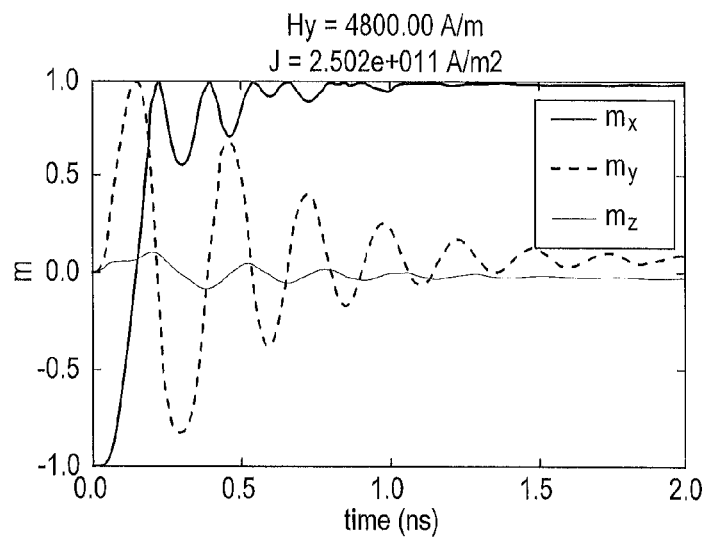
Figure 17:
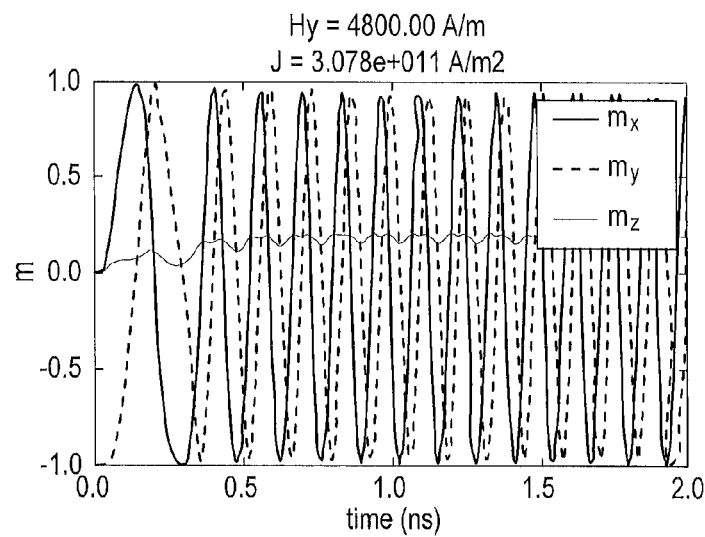

FIGS. 15 to 17 illustrate the temporal variation of the components mx, my and mz (corresponding to the mark Oxyz of FIG. 10) of the magnetisation of the storage layer. The component mx corresponds to the component of the magnetisation along Ox such that when the component mx is equal to +1, this corresponds to the P state and when the component mx is equal to −1, this corresponds to the AP state. The three graphs are obtained for the same transverse field Hy=4800 A/m and three increasing values of the current density passing through the magnetic tunnel junction (respectively $1.541.10^{11}$ A/m$^2$, $2.502.10^{11}$ A/m$^2$ and $3.078.10^{11}$ A/m$^2$ for FIGS. 15, 16 and 17). FIGS. 15 to 17 give examples of variation in real time of the components of magnetisation of the storage layer under the effect of the spin transfer due to the perpendicular polariser in the presence of a transverse field for current densities of three different amplitudes.

FIG. 15 shows that for a transverse field of Hy=4800 A/m, the magnetisation of the storage layer switches very rapidly from the AP state to the P state for a current density of 1.541 $10^{11}$ A/m$^2$. FIG. 16 shows that for a transverse field of Hy=4800 A/m, the magnetisation of the storage layer switches even more rapidly for a higher current density of 2.502 $10^{11}$ A/m$^2$. The switching is followed by small oscillations of magnetisation around the final position of equilibrium but not switching in return to the initial state. The switching takes place substantially in 500 ps for 1.541 $10^{11}$ A/m$^2$ and in substantially 350 ps for 2.502 $10^{11}$ A/m$^2$. Generally speaking, the rate of switching increases with the current density but the latter must not be too high; in fact, if the current density is too high, the magnetisation of the storage layer passes into a maintained precession regime as illustrated in FIG. 17, which shows a maintained oscillation of the components of magnetisation of the storage layer reflecting this maintained precessional movement (rotation) of magnetication. The sought after regime according to the invention is thus that illustrated in FIGS. 15 and 16.

Figure 18:
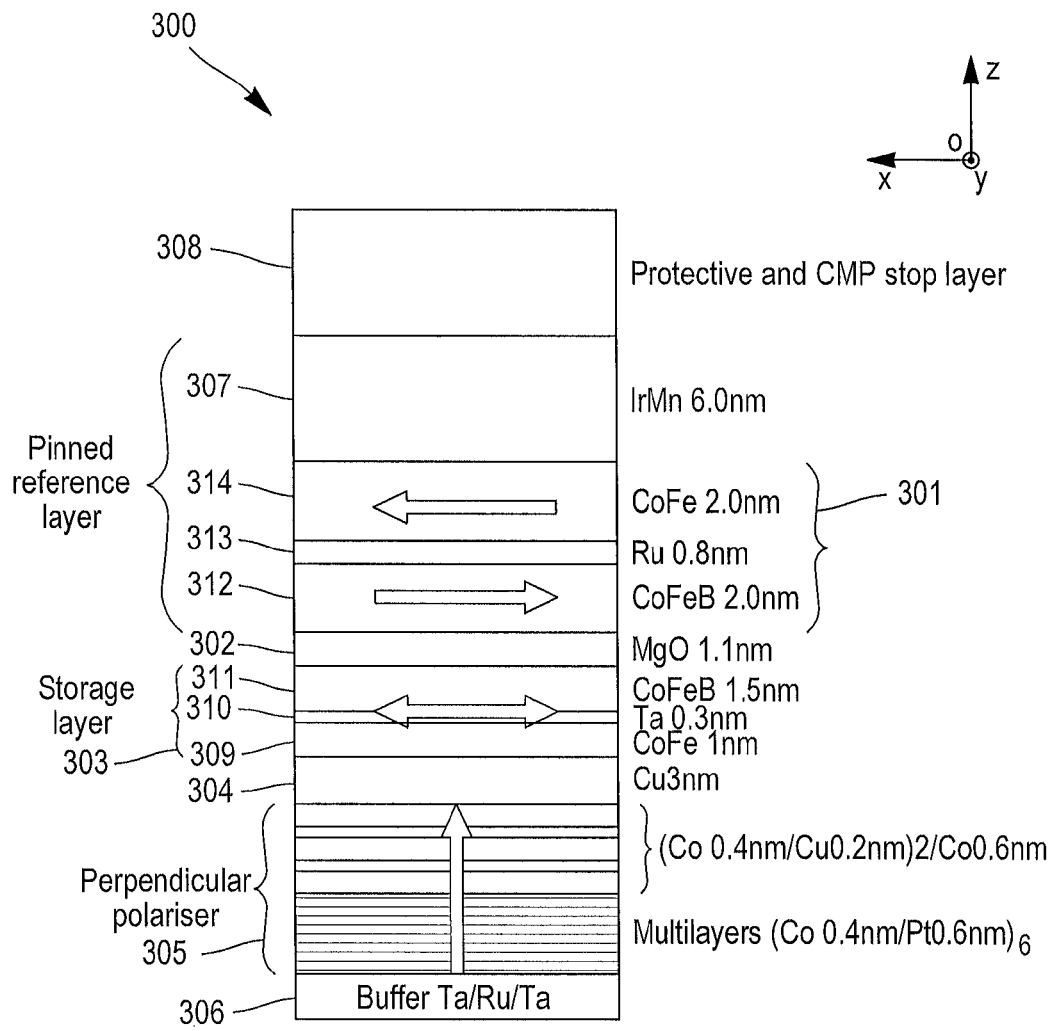
FIGS. 18 to 20 illustrate three examples of magnetic stack that can be used for the device according to an embodiment of the invention.
Figure 19:
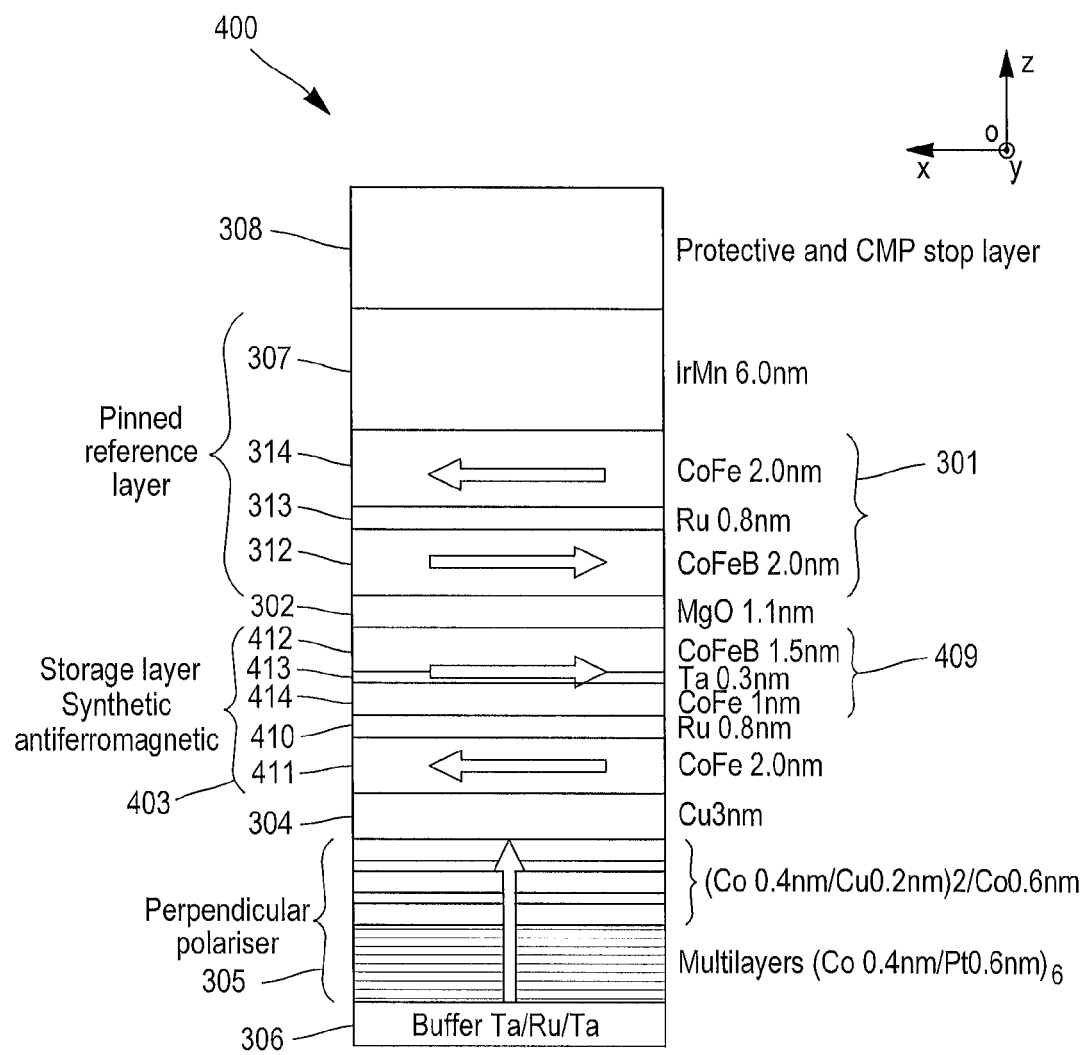
Figure 20:
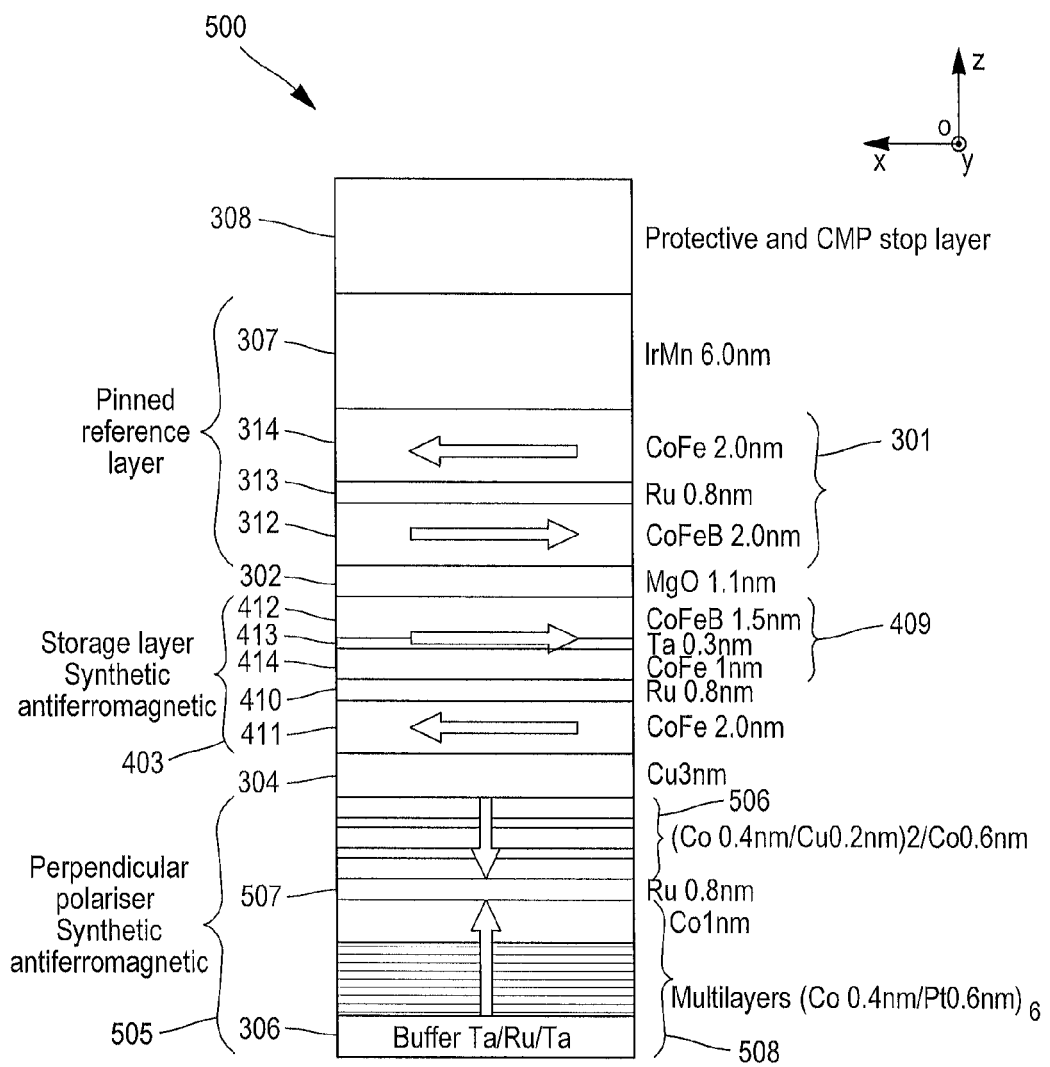

FIGS. 18 to 20 illustrate three examples of magnetic stack that can be used for the device according to the invention.

In the interests of simplification, the distributions of current and the current switching device making it possible to make an electrical current circulate perpendicularly to the plane of the stack of magnetic layers have been voluntarily omitted in the description of the FIGS. 18 to 20 that follows. Similarly, the device configured to apply a transverse magnetic field at least during the writing phase to pass from one position of equilibrium of the direction of magnetisation of the storage layer to the other will be described hereafter with reference to FIGS. 21 and 23 to 26.

FIG. 18 represents a first embodiment of a magnetic device 300 according to the invention.

The magnetic device 300 comprises a stack formed by:
a protective layer 308;
an antiferromagnetic pinning layer 307;
a magnetic reference layer 301 of fixed magnetisation direction (here situated in the plane of the reference layer);
a first non-magnetic spacer 302;
a magnetic storage layer 303 of re-orientable magnetisation direction along two substantially opposite orientation states (two positions of equilibrium substantially along an easy magnetisation axis Ox defined by the fixed magnetisation direction of the reference layer 301);
a second non-magnetic spacer 304;
an electron spin polarisation layer 305, having a magnetisation out of plane of the polarisation layer and of direction perpendicular to that of the reference layer 301;
a buffer layer 306.

The storage layer 303 is a layer with magnetisation in the plane of the variable direction magnetisation layer and having two positions of equilibrium substantially along the axis defined by the fixed magnetisation direction of the reference layer 301 of which the direction of magnetisation is fixed 301 in the plane of the reference layer along the Ox axis. In the case of a magnetoresistive stack having a first non-magnetic spacer 302 which is a MgO tunnel barrier (here 1.1 nm) having a crystallographic bcc (body centred cubic) structure, this storage layer 303 should also desirably have close to the interface with the first spacer 302 a bcc structure. An alloy is then chosen based on Co, Fe and Ni of bcc structure or an amorphous CoFeB alloy that will then be annealed. The storage layer 303 may thus be composed of 3 layers forming a single magnetic block: a magnetic layer of CoFe 309 (of 1 nm) of fcc (face-centred cubic) structure above the second non-magnetic spacer 304, a thin layer of Ta 310 (of 0.3 nm) serving to assure a structural transition from fcc to bcc and to absorb B from the adjacent CoFeB layer (these modes of manufacture being well known to those skilled in the art working on the growth of tunnel junctions based on MgO), and a layer 311 of CoFeB (of 1.5 nm) which crystallises into bcc CoFe on contact with the MgO barrier at the moment of annealing following the deposition of this stack. According to this first embodiment, the storage layer 303 is a simple ferromagnetic layer (simple in the sense where it is formed of a single magnetic "block" as opposed to a synthetic antiferromagnetic).

The tunnel barrier 302 is surmounted by the pinned reference layer 301 which is beneficially constituted of a synthetic antiferromagnetic layer (CoFeB/Ru/CoFe) instead of a simple CoFeB layer, in order to minimise the magnetostatic field radiated by this reference layer 301 on the storage layer 303. In other words, the reference layer 301 is here a synthetic antiferromagnetic layer including two ferromagnetic layers 314 and 312 coupled in an antiparallel manner through a thin antiparallel coupling layer 313, for example made of ruthenium of 0.8 nm thickness. In the case where the first non-magnetic spacer 302 is a MgO tunnel barrier, this synthetic antiferromagnetic reference layer 301 includes a layer 312 of CoFeB of thickness between 2 nm in contact with the MgO barrier 302, a layer 313 of ruthenium of 0.8 nm thickness and a layer 314 of CoFe of typical thickness of 2 nm. This final magnetic layer 314 is here pinned by the antiferromagnetic layer 307 for example made of Ir20Mn80 of 6 nm thickness or made of PtMn.

The antiferromagnetic pinning layer 307 is covered by the protective layer 308 serving to protect it from oxidation during exposure to air during the manufacturing process and also serving as electrical contact with the upper electrode of the stack.

As mentioned above, the interest of using a synthetic antiferromagnetic layer is to minimise the magnetostatic field radiated by the reference layer 301. This field is in fact approximatively along the easy magnetisation axis of the storage layer 303 and has the effect of making dissymmetrical the thermal stability of the P and AP states while favouring an orientation of the magnetisation of the storage layer 303 parallel to this radiated field. It is thus desirable to minimise this field radiated by the reference layer 301 onto the storage layer 303 and this may be done thanks to a correctly balanced synthetic antiferromagnetic layer so that the fields radiated by each of the two constituent layers 312 and 314 at the level of the storage layer 303 compensate each other. This synthetic antiferromagnetic reference layer 301 is itself pinned by an antiferromagnetic layer 307. As is well known to those skilled in the art, the structure is annealed after deposition to crystallise the tunnel barrier and the magnetic electrodes and to orientate the exchange anisotropy produced by the antiferromagnetic layer on the reference layer 301 substantially parallel to the easy magnetisation axis of the storage layer 303.

The first spacer 302 may be a tunnel barrier based on MgO, alumina, HfOx or TiOx.

The electron spin polarisation layer 305 is here separated from the magnetic tunnel junction formed by the reference layer 301, the tunnel barrier 302 and the storage layer 303 by a second non-magnetic spacer 304 being able to be:
a metal spacer, for example made of Cu or Or;
a tunnel barrier of smaller RA product (resistance*area product) than that constituting the first spacer 302. It may be constituted of the same material as the first spacer 302 (for example made of MgO) but of lesser thickness or of a different material, in an embodiment of lower barrier height so that its electrical resistance is less than that of the first spacer 302;
a confined current path layer. Such a layer is constituted of an insulating layer pierced with conductive paths of diameter typically from 1 to several nanometers. Such a layer is for example formed by oxidation of an Al99Cu1 alloy. During oxidation, aluminium oxidises into AlOx whereas copper, which is less oxidisable than aluminium, coalesces into small clusters forming conductive paths. By playing on the density and the size of the conductive paths, the RA product may be adjusted to the desired value.

The electron spin polarisation layer 305 has a magnetisation out of plane of the polarisation layer and of direction perpendicular to that of the reference layer 301.

The polarisation layer or perpendicular polariser 305 is for example a ferromagnetic layer or a simple multilayer.

As represented in FIG. 18, the perpendicular polariser 305 may include a periodic multilayer (Co/Pt) (for example Co0.4 nm/Pt0.6 nm with 6 repetitions) with strong perpendicular anisotropy coupled to a layer of Co of 0.6 nm including very thin laminations of copper making it possible to reduce the spin diffusion length in this stack (Co/Cu) (for example two repetitions of Co0.4 nm/Cu0.2 nm) such that the spin polarisation of the current can be constructed on the small thickness of this perpendicular polariser.

The purpose of the buffer layer 306 is to promote the growth of the entire structure and to establish electrical contact with the lower electrode. It may be layers of CuN, Ta, NiFeCr, Ru, Pt, Cu, a multilayer Ta/Ru/Ta. The thickness of this layer 306 may vary from 1 to several hundreds of nm.

FIG. 19 represents a second embodiment of a magnetic device 400 according to the invention. The device 400 is virtually identical to the device 300 of FIG. 18 (common elements moreover bear the same reference numbers) with the exception of the production of the storage layer 403 which differs from the layer 303 of the device 300.

The layer 403 is here a synthetic antiferromagnetic storage layer, that is to say composed of two ferromagnetic layers 409 and 411 coupled in an antiparallel manner through an antiparallel coupling layer 410 such as ruthenium of 0.8 nm thickness. By doing so, the volume of the storage layer 403 is increased and its internal field is also made more uniform. Consequently, the switching of magnetisation by spin transfer takes place more coherently which makes it possible to lower the critical breakover current. Such a layer 403 makes it possible to increase the thermal stability of the magnetisation of the storage layer and thus the retention of the memory. It makes it possible to further reduce magnetostatic interaction with the reference layer. It also makes it possible to have a more "macrospin" behaviour of the magnetisation of the storage layer during magnetic switching that is to say that this magnetisation switches more like a rigid block thanks to a phenomenon of magnetic flux closing between the two anti-ferromagnetically coupled magnetic layers constituting this storage layer. This flux closing means that the inner field in the storage layer is more homogeneous which leads to this switching being more coherent and thus more reproducible from one writing event to another.

As regards the referential orientation of the direction of the transverse field, those skilled in the art will easily understand that with respect to the discussion of FIG. 10, the situation is reversed if a synthetic antiferromagnetic storage layer is used. In fact, in this case, for a given sense of the orientation of the perpendicular polariser (parallel or antiparallel to the z axis) and for a given sense of the magnetisation of the planar analyser (a sense or the opposite sense along the easy magnetisation axis of the storage layer), the desired orientation of the transverse field making it possible to benefit both from the action of the perpendicular polariser and the planar analyser is that which satisfies the inequality:

$$(\vec{M}_{planaranalyser} \times \vec{P}) \cdot \vec{H}_y < 0.$$

The layer 409 is identical to the layer 303 of FIG. 18 and is thus composed of 3 layers forming a single magnetic block: a magnetic layer of CoFe 412 (of 1 nm) of fcc (face-centred cubic) structure above the second non-magnetic spacer 304, a thin layer of Ta 413 (of 0.3 nm) serving to assure a structural transition from fcc to bcc and to absorb B from the adjacent CoFeB layer, and a layer 414 of CoFeB (of 1.5 nm) which crystallises into bcc CoFe on contact with the MgO barrier.

The layer 411 is for example a layer of CoFe of typical thickness of 2 nm in contact with the second spacer 304.

FIG. 20 represents a third embodiment of a magnetic device 500 according to the invention. The device 500 is virtually identical to the device 400 of figure (common elements moreover bear the same reference numbers) with the exception of the production of the electron spin polarisation layer 505 which differs from the layer 305 of the device 400.

The perpendicular polariser 505 is here a layer known as synthetic antiferromagnetic constituted of two layers 506 and 508 of fixed magnetisation oriented out of plane and coupled in an antiparallel manner through a layer 507 able to induce antiferromagnetic coupling between adjacent ferromagnetic layers such as for example a thin layer of ruthenium of 0.8 nm thickness.

The layer 508 has a magnetisation out of plane of the polarisation layer and of direction perpendicular to that of the reference layer 301 and is for example constituted by a simple periodic multilayer (Co/Pt) (for example Co0.4 nm/Pt0.6 nm with 6 repetitions) with strong perpendicular anisotropy coupled to a layer of Co of 0.6 nm.

The layer 506 also has a magnetisation out of plane of the polarisation layer and of direction perpendicular to that of the reference layer 301 antiparallel to the magnetisation of the layer 508. The layer 506 is for example formed of a layer of fixed magnetication of composition (Co 0.4 nm/Cu 0.2 nm)$_2$/Co 0.6 nm.

The benefit of replacing the single magnetisation layer fixed by such a synthetic antiferromagnetic structure is to make the magnetisation of the fixed magnetisation layer even more pinned and thus resistant to magnetic perturbations. This again reduces the out of plane field radiated by the perpendicular polariser on the magnetisation of the storage layer. This out of plane field adversely affects the thermal stability of the magnetisation of the storage layer and thus retention and also adversely affects the coherence of magnetic switching as explained for example in the publication "Improved coherence of ultrafast spin-transfer-driven precessional switching with synthetic antiferromagnet perpendicular polarizer" (Vaysset et al., Applied Physics Letters 98 (2011) 242511).

It is understood that the stacks described above could be produced by reversing all the layers in a block and thus by placing the perpendicular polariser at the top of the stack and the reference layer at the bottom of the stack.

The remainder of the description relates to different embodiments making it possible to obtain the devices 105 and 205 of FIGS. 7 and 10 for applying, at least during the writing phase to pass from one position of equilibrium of the direction of magnetisation of the storage layer to the other, the transverse field, the direction of which is substantially parallel to the plane of the storage layer and substantially perpendicular to the easy magnetisation axis of the storage layer.

Figure 21:
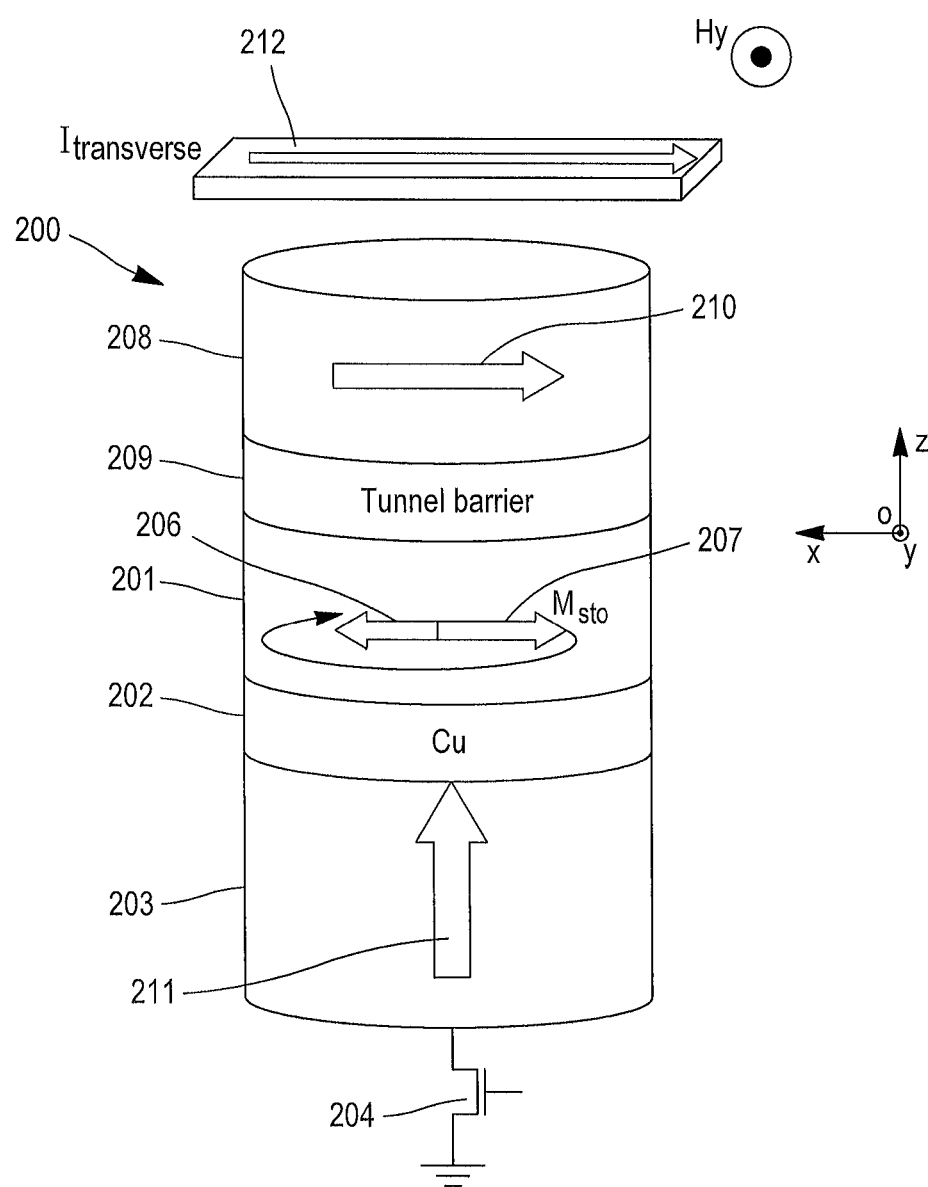
FIG. 21 illustrates a first embodiment of the device configured to apply a transverse field, uniquely during writing.

According to a first embodiment illustrated in FIG. 21 which represents the device 200 of FIG. 10, the device configured to apply the transverse field Hy can make it possible to apply the field uniquely (i.e. temporarily) during writing.

To do so, a conducting line 212 is added above or below the device 200 as is known to those skilled in the art for memories with field writing (such as for example "Toggle" type memories developed by the firm Everspin or thermally assisted writing memories developed by the firm Crocus Technology). The field is then produced by sending a current $I_{transverse}$ through this conducting line 212 according to the Ampere theorem. In order that the field Hy created is transversal to the easy magnetisation axis of the storage layer 201 (large axis of the ellipse if the tunnel junction has an elliptical shape), the field generation line 212 is substantially parallel to this easy magnetisation axis.

The drawback of such an approach consisting in creating a field uniquely during writing is the electrical consumption associated with the creation of the field. To create a field substantially equal to 5000 A/m, a current of 5 to 10 mA is desired, which is considerable in microelectronics and would preclude producing very dense memories using this technology.

As a result, it may be technically easier and less energy consuming to apply the transverse field permanently thanks to a layer of hard material or of pinned magnetisation situated near to the tunnel junction and even integrated in the stack of the tunnel junction as illustrated in the figures which are going to be described hereafter. In this case, the principle is based on the fact of using as transverse field the field radiated by a layer of permanent magnet type, the magnetisation remaining substantially unchanged during the entire operation of the device. The benefit is that in this case there is no energy consumption associated with the creation of the transverse field. There exists nevertheless two minor drawbacks associated with this approach.

Firstly, the presence of this permanent transverse field reduces the thermal stability of the magnetisation of the storage layer by reducing the height of barrier separating the two stable states of magnetisation. This can nevertheless remain entirely acceptable for quick memories (of the order of a sub-nanosecond) targeting applications of SRAM type which do not necessarily require long retentions (sometimes retentions of is may be sufficient).

The other drawback is a slight reduction in the amplitude of magnetoresistance tunnel at the moment of reading. In fact, due to the presence of the transverse field, the magnetisation of the storage layer is no longer perfectly in parallel or antiparallel alignment.

Figure 22B:
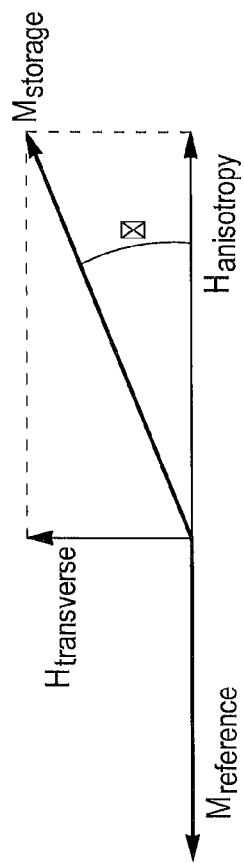
FIGS. 22a and 22b illustrate the deviation of the magnetisation of the storage layer with respect to the easy magnetisation axis linked to the application of the transverse field in a device according to an embodiment of the invention.
Figure 22A:
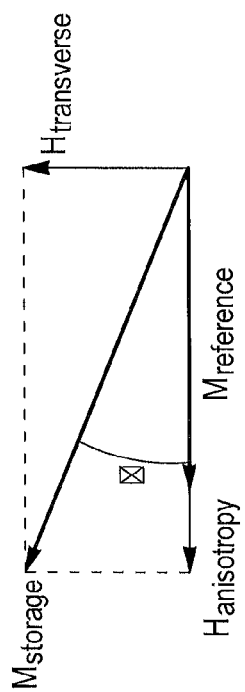

The loss of magnetoresistance may be easily calculated from the angle of deviation of the magnetisation of the storage layer with respect to the easy magnetisation axis linked to the application of the transverse field. This phenomenon is illustrated in FIGS. 22a (deviation of the magnetisation of the storage layer with respect to a parallel state) and 22b (deviation of the magnetisation of the storage layer with respect to the antiparallel state). The energy of magnetisation of the storage layer subjected to its anisotropy (characterised by the anisotropy constant per unit of volume K) and to the transverse field is written E=K cos²θ−MsH$_y$ sin θ where θ is the angle between the magnetisation of the storage layer and its easy magnetisation axis, Ms the magnetisation of this layer and Hy the transverse field. The minimisation of this energy leads to $$\sin\theta = \frac{M_s H_y}{2K}.$$

The transverse field should be sufficiently small with respect to $$H_K = \frac{2K}{M_s}$$

in order that the angle of deviation is not too large and does not reduce the magnetoresistance tunnel too much. The conductance G varies as a function of the angle between magnetisation of the reference and storage layer as $$G(\theta) = G_p - \Delta G \frac{(1-\cos\theta)}{2}$$

where ΔG represents the variation in conductance (magnetoconductance) between perfect P and AP alignment: ΔG=G (0)−G(π)=1/R(0)−1/R(π), R being the resistance of the tunnel junction that is to say the inverse of its conductance.

In the presence of the transverse field Hy, the angle of magnetisation varies from θ to π−θ instead of varying from 0 to π. As a result, the effective magnetoconductance ΔG$_{eff}$ is given by $$\Delta G_{eff} = \Delta G \sqrt{1-\left(\frac{M_s H_y}{2K}\right)^2} = \Delta G\sqrt{1-\left(\frac{H_y}{H_K}\right)^2}.$$

The effect of the transverse field on the amplitude of magnetoconductance is not very important in practice. For example, for a tunnel junction of elliptical shape, Hk may take values of the order of 15000 A/m. If Hy equals 5000 A/m then ΔG$_{eff}$=0.94ΔG which signifies that the magnetoresistance tunnel and/or the magnetoconductance tunnel (the two are equivalent in amplitude since mathematically $$\frac{\Delta R}{R_P} = \frac{\Delta G}{G_{AP}})$$

drop in relative value by 6% between the absence of transverse field and the presence of transverse field equal to ⅓ of the anisotropy field. Such a reduction is entirely acceptable with regard to the benefit gained in terms of control of the dynamic of switching and control of the final state that it is wished to write in the memory point.

To create a permanent transverse field on the storage layer, several solutions are possible as illustrated in FIGS. 23 to 26. The different embodiments of the device 205 configured to apply a permanent transverse field will be illustrated with regard to the device 200 of FIG. 10 it being understood that these devices may be used for other structures of the stack of the device according to the invention, for example in the case of FIGS. 18 to 20. The general principle is to create this permanent field using a hard material or of pinned magnetisation of which the field radiated at the level of the storage layer constitutes the permanent transverse field.

Figure 23:
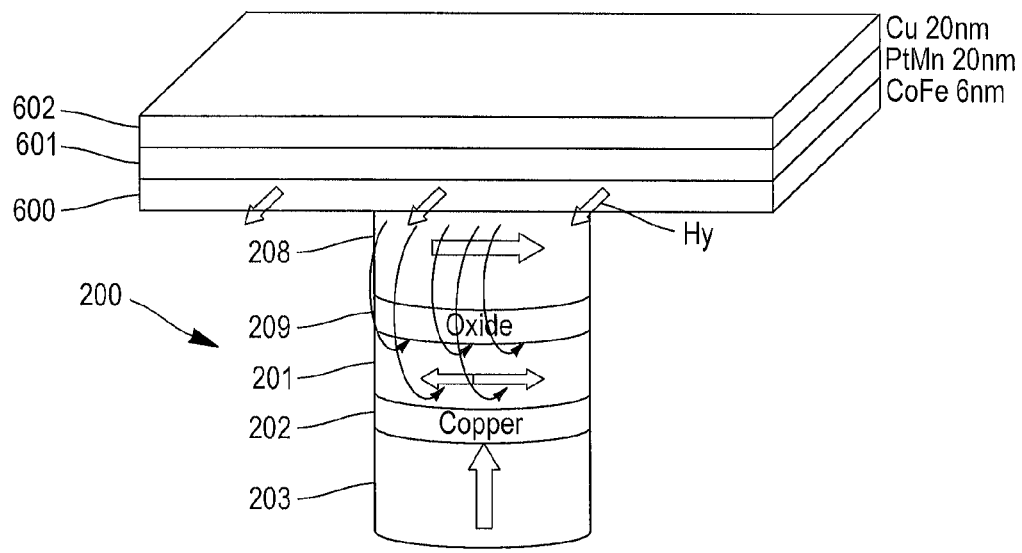
FIGS. 23 to 26 illustrate four embodiments of devices configured to apply a permanent transverse field in the device according to the invention.

A first way of creating this permanent field is illustrated in FIG. 23. It consists in integrating above the reference layer 208, a magnetic layer 600 for example constituted of a cobalt-iron alloy of 6 nm thickness and an antiferromagnetic pinning layer 601, for example made of PtMn over a thickness of 20 nm, the two layers 600 and 601 being below the conducting line 602 (for example made of Cu) electrically connecting one of the electrodes of the device according to the invention. The layer 600 of material with strong magnetisation is pinned by exchange anisotropy. As mentioned above, the reference layer 208 is usually itself pinned by an antiferromagnetic pinning layer (for example a layer of IrMn as illustrated in FIGS. 18 to 20).

Since the reference layer 208 and the layer 600 serving to create the transverse field Hy are pinned in two different directions (one parallel to the easy magnetisation axis of the storage layer 201, the other transversally to this direction), it is possible to use two antiferromagnetic pinning layers having different blocking temperatures for one or the other layer, for example a layer not represented of IrMn (the blocking temperature of which is T$_{B\ IrMn}$~230° C.) to pin the reference layer and a layer 601 made of PtMn (the blocking temperature of which is T$_{B\ PtMn}$~320° C.) to pin the layer for creating the transverse field Hy.

Thus, the antiferromagnetic layer 601 (PtMn) has a blocking temperature greater than the antiferromagnetic pinning layer of the reference layer. The fact of having different blocking temperatures particularly makes it possible to orient successively the magnetisations of the layer of formation of the transverse field then of the reference layer. It should be noted that it would be possible on the contrary to orientate firstly the magnetisation of the reference layer then secondly that of the layer for applying the transverse field. It would then be needed that the blocking temperature of the antiferromagnetic layer for pinning the reference layer is greater than that of the antiferromagnetic layer 601 for pinning the layer for applying the transverse field.

In the configuration of FIG. 23, during under field cooling from the highest blocking temperature, it is firstly possible to pin the magnetisation of the layer 600 coupled to the antiferromagnetic layer 601 of highest blocking temperature during cooling from $T_{B\ PtMn}$ to $T_{B\ IrMn}$. The field applied during annealing is then turned in the desired direction to pin the reference layer coupled to the antiferromagnetic layer of lower blocking temperature and cooling is carried out in this new field from $T_{B\ IrMn}$ to ambient temperature.

The curved arrows represent the field radiated by the layer 600 of CoFe on the storage layer 201. The straight arrows represent the direction of the transverse field (and thus the magnetisation) of the layer 600 of CoFe.

Figure 24:
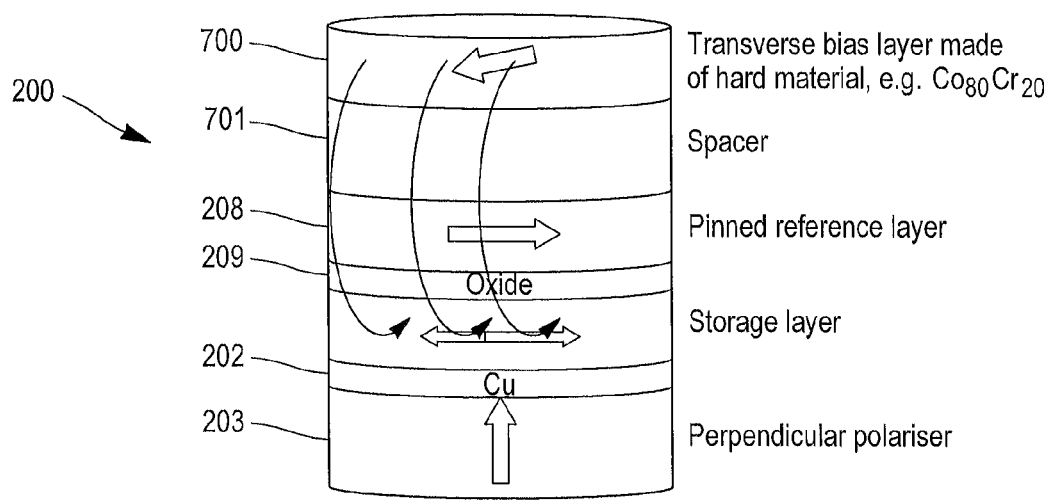

A second manner of creating this permanent field is illustrated in FIG. 24. It consists in integrating above the reference layer 208, a layer 700 of hard material, for example of $Co_{80}Cr_{20}$ of a thickness of several nanometers (for example 5 nm) forming a permanent magnet creating a transverse polarisation field. The "hardness" of a magnetic layer is defined with respect to the value of the coercive magnetic field necessary for the reversal of the magnetisation of the layer. Such a magnetic layer will thus be considered "harder" if its coercive field is stronger.

The layer of hard material 700 may be moved away from the reference layer 208 tunnel barrier 4 via the use of a spacer layer 701, for example made of Ta.

The magnetisation of the layer for applying the transverse field may be oriented in the transverse direction after the step of annealing the structure by applying a saturating field in the transverse direction. It will be noted that this layer can also be placed at the base of the stack instead of being placed at the top of the stack.

Figure 25:
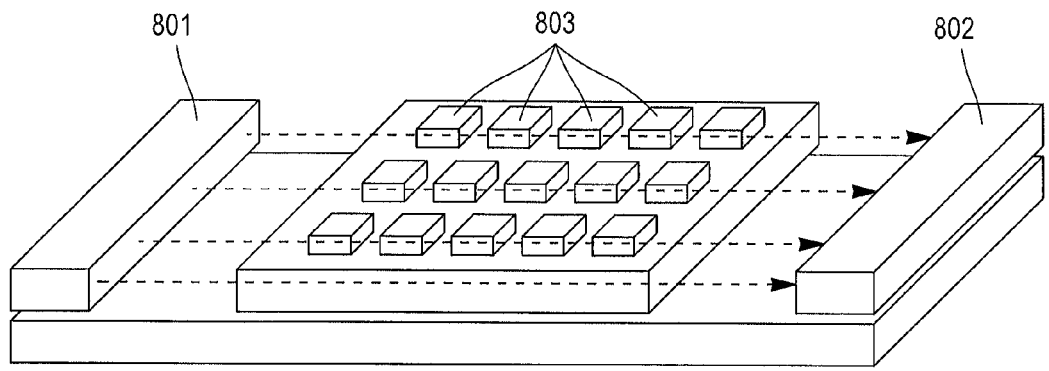

According to another embodiment represented in FIG. 25, it is also possible to use as device configured to generate the transverse field permanent magnets 801 and 802 situated on either side of a device according to the invention or a block with several devices according to the invention 803 such as memory, memristor or logic components, these two permanent magnets creating a transverse field on the whole of the block.

Figure 26:
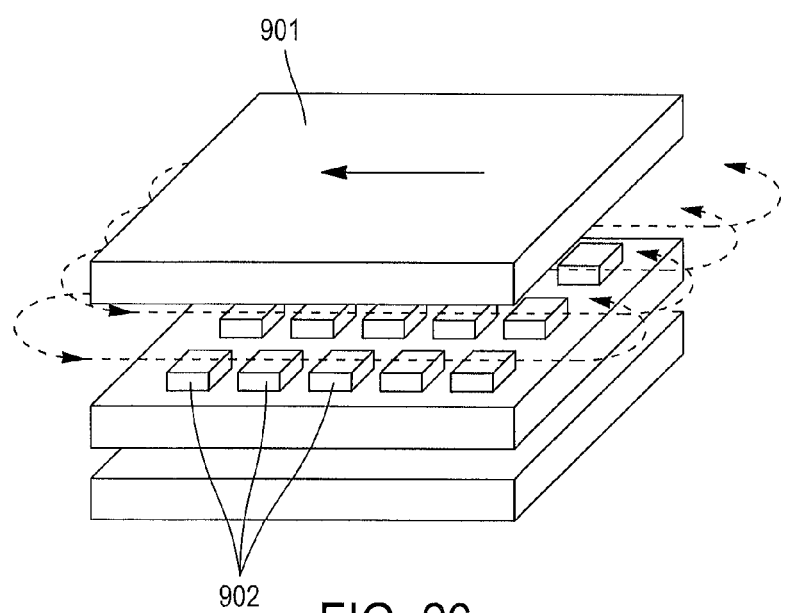

According to another embodiment represented in FIG. 26, it is also possible to use as device configured to generate the polarisation field a permanent magnet 901 situated above or below one or more memory points 902, memristors or logical components, and covering all of said memory points 902. This permanent magnet is for example made of a hard material or of pinned magnetisation.

Naturally, the invention is not limited to the embodiments described with reference to the figures and variants may be envisaged without going beyond the scope of the invention. In particular, the materials and the thicknesses chosen to form the device configured to apply the transverse field, the reference layers, the storage layers, the spacers and the perpendicular polarisers are only given here for illustrative purposes and other materials or thicknesses could be used.

The invention claimed is:

1. A magnetic device comprising:
   a first magnetic layer having a uniaxial anisotropy with an easy magnetisation axis in a plane of said first magnetic layer and having a magnetisation of variable direction having two positions of equilibrium along said easy magnetisation axis;
   a second magnetic layer having a magnetisation perpendicular to that of said first magnetic layer and situated out of plane of the second magnetic layer;
   a device configured to make circulate in the layers, and perpendicularly thereto, a current pulse to switch from one position of equilibrium of the direction of magnetisation of the first magnetic layer to the other, and
   a device configured to apply a transverse magnetic field, a direction of which is substantially parallel to the plane of said first magnetic layer and substantially perpendicular to the easy magnetisation axis of the first magnetic layer,
   wherein said device configured to make a current pulse circulate and said device configured to apply a transverse magnetic field are configured such that a scalar product $(\vec{J} \times \check{M}_{initial}) \cdot \check{H}_y$, the sign "×" designating the vectorial product, is of the same sign as a component of the magnetisation of the second magnetic layer along an axis going from the second magnetic layer to the first magnetic layer, where $\check{M}_{initial}$ represents an initial magnetisation vector in one of the two positions of equilibrium of the first magnetic layer, $\check{M}$ represents a current density vector to switch the magnetisation of the first magnetic layer from the initial state $\check{M}_{initial}$ corresponding to the position of equilibrium before switching to a final state corresponding to the second state of equilibrium after switching and $\check{H}_y$ represents the vector of the transverse field, and
   wherein the amplitude of the writing current pulse and that of the transverse magnetic field are chosen to switch the magnetisation of the first magnetic layer from one position of equilibrium to another position of equilibrium, the final state of the magnetisation of the first magnetic layer being controlled by the direction of the current pulse passing through the stack, independently of its initial state and the duration of the writing current pulse.

2. The device according to claim 1, further comprising:
   a third magnetic layer having a magnetisation of fixed direction situated in a plane of the third magnetic layer substantially along said easy magnetisation axis;
   a non-magnetic layer separating said third magnetic layer and said first magnetic layer.

3. The device according to claim 2 wherein at least one of said third magnetic layer, first magnetic layer and second magnetic layer is a synthetic antiferromagnetic layer formed of two layers of fixed magnetisation and coupled in an antiparallel manner by a layer able to induce antiferromagnetic coupling between ferromagnetic layers.

4. The device according to claim 3, wherein when the first magnetic layer is a synthetic antiferromagnetic layer, the direction of the transverse field is chosen with respect to the direction of magnetisation of said third magnetic layer and that of said second magnetic layer such that the scalar product $(\check{M}_{planaranalyser} \times \check{P}) \cdot \check{H}_y$ is strictly negative, where $\check{M}_{planaranalyser}$ is the magnetisation vector of fixed direction of the third magnetic layer and $\check{P}$ is the magnetisation vector of the second magnetic layer.

5. The device according to claim 4, further comprising a layer separating said first magnetic layer and said second magnetic layer, wherein said non-magnetic layer is a tunnel barrier and said layer separating said first magnetic layer and said second magnetic layer is chosen from the following elements:

a tunnel barrier;

a confined current path barrier;

a non-magnetic metal layer.

6. The device according to claim 2, wherein at least one of said third magnetic layer and second magnetic layer has a magnetisation pinned by interaction with an antiferromagnetic pinning layer.

7. The device according to claim 2, wherein the direction of the transverse field is chosen with respect to the direction of magnetisation of said third magnetic layer and that of said second magnetic layer such that the scalar product $(\check{M}_{planaranalyser} \times \check{P}) \cdot \check{H}_y$ is strictly positive, where $\check{M}_{planaranalyser}$ is the magnetisation vector of fixed direction of the third magnetic layer and $\check{P}$ is the magnetisation vector of the second magnetic layer.

8. The device according to claim 2, further comprising a layer separating said first magnetic layer and said second magnetic layer and wherein a product of a resistance times a surface of said non-magnetic is greater than the product of the resistance times a surface of said layer separating said first magnetic layer and said second magnetic layer.

9. The device according to claim 1, further comprising a layer separating said first magnetic layer and said second magnetic layer.

10. The magnetic device according to claim 1, wherein said device configured to apply said transverse field is formed by a layer of ferromagnetic material.

11. The magnetic device according to claim 1, wherein said device configured to apply said transverse field is formed by a layer of ferromagnetic material the magnetisation of which is pinned by an antiferromagnetic layer.

12. The magnetic device according to claim 1, wherein said device configured to apply said transverse field is formed by a field generating conducting line in which a current circulates.

13. The magnetic device according to claim 1, wherein said device configured to apply said transverse field is formed by a permanent magnet situated above or below the magnetic stack.

* * * * *

UNITED STATES PATENT AND TRADEMARK OFFICE
CERTIFICATE OF CORRECTION

PATENT NO. : 9,455,012 B2
APPLICATION NO. : 14/952099
DATED : September 27, 2016
INVENTOR(S) : Bernard Dieny et al.

It is certified that error appears in the above-identified patent and that said Letters Patent is hereby corrected as shown below:

On the Title Page

Item (73) Assignees:

Please correct second Assignee name to read:
CENTRE NATIONAL DE LA RECHERCHE SCIENTIFIQUE (CNRS), Paris (FR)

Please correct the fourth Assignee name to read:
UNIVERSITÉ PARIS SUD, Orsay (FR)

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*